United States Patent [19]
Newell et al.

[11] Patent Number: 5,185,585
[45] Date of Patent: Feb. 9, 1993

[54] CRYSTAL OSCILLATOR AND METHOD WITH AMPLITUDE AND PHASE CONTROL

[75] Inventors: Gerald R. Newell, Alamo; Michael W. Nootbaar, Benicia; Pradeep Bhardwaj, Concord; Robert C. Willson, Martinez, all of Calif.

[73] Assignee: New SD, Inc., San Francisco, Calif.

[21] Appl. No.: 756,847

[22] Filed: Sep. 10, 1991

Related U.S. Application Data

[63] Continuation-in-part of Ser. No. 530,640, May 30, 1990, Pat. No. 5,047,734.

[51] Int. Cl.$^5$ .................... H03B 1/04; H03B 5/32; H04B 15/00
[52] U.S. Cl. .................... 331/46; 331/65; 331/105; 331/158; 331/175; 331/183; 455/295
[58] Field of Search .................... 331/46, 65, 66, 105, 331/109, 116 R, 116 FE, 158, 160, 175, 182, 183; 455/295; 340/595; 374/173, 183, 184

[56] References Cited

U.S. PATENT DOCUMENTS

| | | | |
|---|---|---|---|
| 3,731,230 | 5/1973 | Cerny, Jr. | 331/116 R |
| 3,735,266 | 5/1973 | Amitay | 333/2 X |
| 4,358,742 | 11/1982 | Ferriss | 331/158 |
| 4,571,558 | 2/1986 | Gay et al. | 331/158 X |
| 4,646,033 | 2/1987 | Perkins | 331/158 X |
| 4,810,922 | 3/1989 | Hirsch | 331/116 R X |

Primary Examiner—Siegfried H. Grimm
Attorney, Agent, or Firm—Flehr, Hohbach, Test, Albritton & Herbert

[57] ABSTRACT

Crystal oscillator and method which in one embodiment have a crystal element connected in a positive feedback loop with a charge amplifier and an integrator, with the gain of the loop being maintained at a level of unity. Compensation is provided to offset the effects of shunt capacitance in the crystal element, and precise phase control is maintained around the loop. In other embodiments, a crystal element is connected in a series feedback loop with a buffer amplifier, and operation is provided by maintaining the oscillation signal at level at which distortion, clipping, and saturation do not occur. Compensation for shunt capacitance across the crystal element is provided by applying a compensation signal which is equal in amplitude but opposite in phase to the signal passing through the shunt capacitance to the input terminal of the buffer amplifier to cancel the effect of the shunt capacitance. Compensation is also provided to cancel interfering crosstalk signals between oscillators in systems with more than one oscillator.

54 Claims, 14 Drawing Sheets

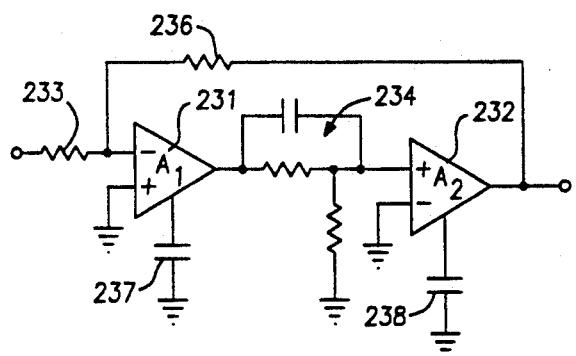
FIG. 18A
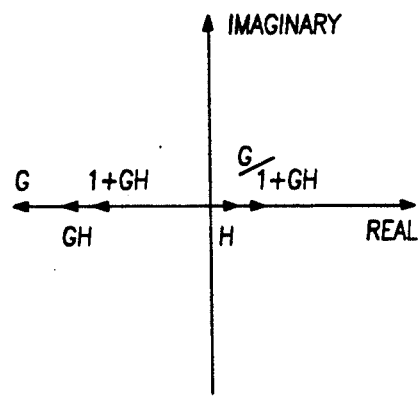
FIG. 18B
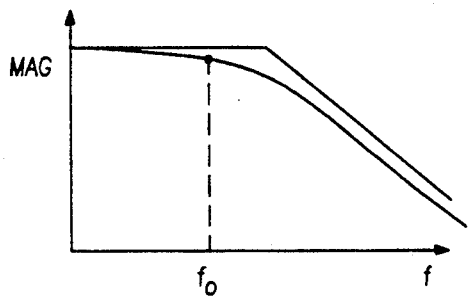
FIG. 19A
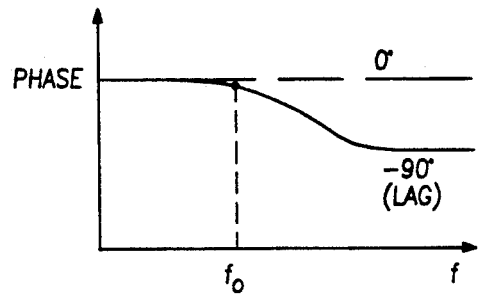
FIG. 19B
FIG. 19C
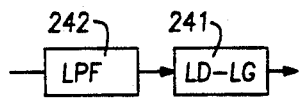
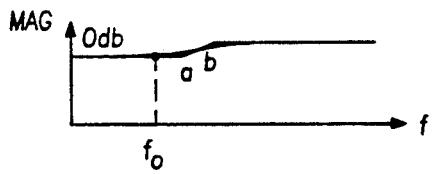
FIG. 19D
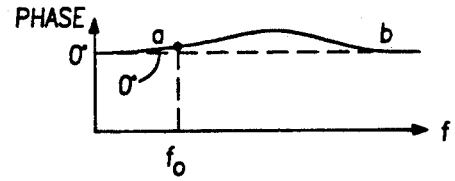
FIG. 19E
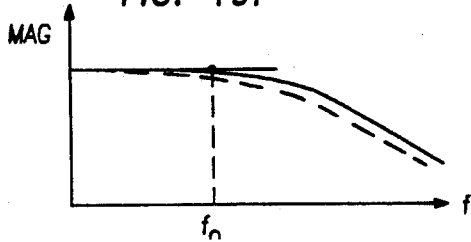
FIG. 19F
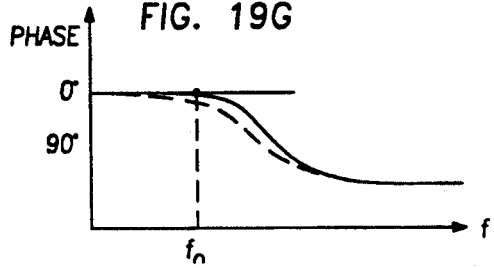
FIG. 19G

CRYSTAL OSCILLATOR AND METHOD WITH AMPLITUDE AND PHASE CONTROL

CROSS-REFERENCE TO RELATED APPLICATION

This is a continuation-in-part of Ser. No. 07/530,640, filed May 30, 1990 in the names of Gerald R. Newell, Michael W. Nootbaar, and Pradeep Bhardwaj and now U.S. Pat. No. 4,047,734.

BACKGROUND OF THE INVENTION

1. Field of the Invention

This invention relates to crystal oscillators, and, more particularly, to a crystal oscillator and method with amplitude and phase control for providing low distortion output signals.

2. Prior Art

FIG. 1 shows a series feedback crystal oscillator circuit 10 which includes a noninverting amplifier 12 and a crystal 14 in the positive feedback path. The crystal has low impedance at series resonance frequency and high impedance at other frequencies, so the feedback signal is greatest at series resonance. If the amplifier 12 has sufficient gain, the circuit 10 oscillates at a frequency near the crystal resonant frequency. Total loop gain for oscillation, including the effect of the crystal impedance, must be precisely 1. Additional gain causes the amplitude of the oscillation signal to grow until the amplifier begins to clip the signal or to saturate causing the time-averaged gain of the current to drop to 1, at which point the oscillator operation is stable.

Many oscillator circuits are designed to allow the amplifier to clip the oscillation signal at predetermined levels. This design approach produces poor amplitude control for the signals at the crystal input terminal, since the clipping levels or saturation characteristics of a saturating element often vary with time, temperature, power supply levels, and with other environmental factors. A crystal input terminal is a poor place to attempt to obtain amplitude control because the physical amplitude of the oscillation signal is best measured in terms of the output current of the crystal, not its input voltage. Due to non-linearities in the crystal transfer function, the resonant frequency of the crystal may be a function of the amplitude of the oscillation signal so it is more important to have control of the amplitude of the crystal output signal instead of the crystal input signal.

Prior art designs for oscillator circuits have produced large harmonic-component signals due to clipping of the oscillation signal. These harmonics may cause interference to other circuits. Harmonic signals pass through the shunt capacitor $C_o$ of the crystal, which can cause problems with the oscillator amplifier and make it difficult to cancel the effect of $C_o$. An additional effect of non-linear operation is that the phase shift though the oscillator circuit cannot be accurately predicted. The phase shift depends on the amount of time that a saturated component takes to recover from saturation. Recovery time can vary greatly depending on environmental conditions. The unpredictability of phase shift is especially important when using low Q crystals which produce significant changes in frequency for small changes in phase shift.

A non-crystal controlled prior art sinewave oscillator used as a waveform generator is disclosed in a 1976 National Semiconductor Company publication entitled "Linear Applications," Volume 1, AN72-19. The frequency selective element is formed by two RC active filter stages. The average value of the sinewave output voltage is detected. The output level is regulated by comparing the average value of the sinewave to a DC reference voltage to provide a sinewave output signal using a differential averaging circuit.

OBJECTS AND SUMMARY OF THE INVENTION

It is in general an object of the invention to provide a new and improved crystal oscillator and method.

Another object of the invention is to provide a crystal oscillator and method of the above character which overcome the limitations and disadvantages of crystal oscillators heretofore provided.

Another object of the invention is to provide a crystal oscillator and method of the above character in which phase relationships are accurately maintained.

Another object of the invention is to provide a crystal oscillator and method of the above character in which overtone modes of the crystal are suppressed.

These and other objects are achieved in accordance with the invention by providing, in one embodiment, a crystal oscillator and method in which a crystal element is connected in a positive feedback loop with a charge amplifier and an integrator, and the gain of the loop is automatically maintained at a level of unity. Compensation is provided to offset the effects of shunt capacitance in the crystal element, and precise phase control is maintained around the loop.

In other embodiments, a crystal element is connected in a series feedback loop with a buffer amplifier, and operation is provided by maintaining the oscillation signal at a level at which distortion, clipping, and saturation do not occur. Compensation for shunt capacitance across the crystal element is provided by automatically applying a compensation signal which is equal in amplitude but opposite in phase to the signal passing through the shunt capacitance to the input terminal of the buffer amplifier to cancel the effect of the shunt capacitance. Compensation is also provided to cancel interfering crosstalk signals between oscillators in systems with more than one oscillator.

BRIEF DESCRIPTION OF THE DRAWINGS

FIGS. 17A-17B and 18A-18B illustrate a technique utilizing phase shifts of 0° and 180° to avoid phase errors in the embodiment of FIG. 11.

FIGS. 19A-19G illustrate a phase control technique in which phase cancellation is provided at the frequency of interest to eliminate phase errors in the embodiment of FIG. 11.

DETAILED DESCRIPTION

Figure 2:
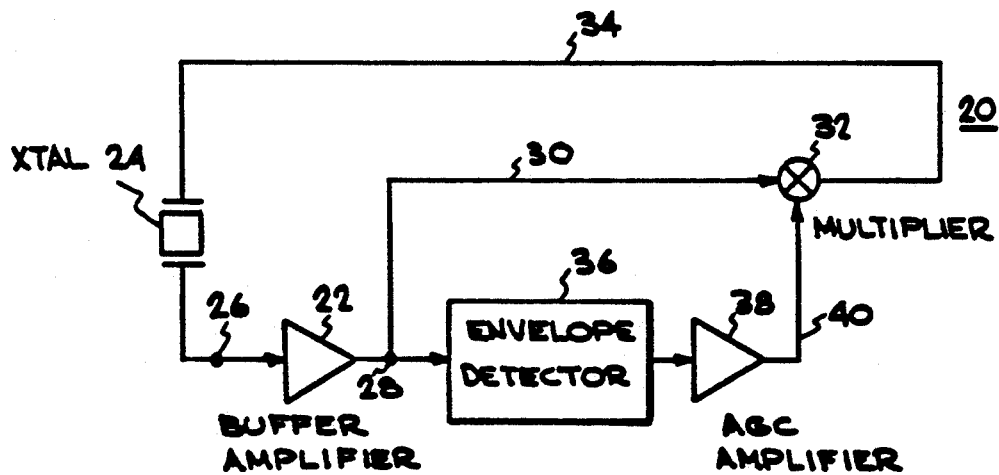
FIG. 2 is a circuit diagram of an embodiment of a series feedback crystal oscillator circuit according to the invention in which an amplitude control circuit controls the feedback signal.

FIG. 2 shows an oscillator circuit 20 which includes a noninverting buffer amplifier 22 with one terminal of a series feedback crystal element 24 connected in series with an input terminal 26 of the buffer amplifier 22. The output terminal 28 of the amplifier 22 is coupled through a signal line 30 to a linear wideband, analog multiplier circuit 32, which functions as a linear, gain-controlled amplifier for the oscillator signal. The output signal from the multiplier circuit 32 is coupled through signal line 34 to the other terminal of the crystal element 24. The looped path comprising the amplifier 22, signal line 30, the linear multiplier 32, signal line 34, and the crystal 24 form a series-feedback oscillator circuit. An oscillation signal passes around the loop. An envelope detector 36 detects the amplitude of the oscillation signal at the output terminal 28 of the amplifier 22. The detected signal is passed through an automatic gain control AGC amplifier 38 which provides signal gain and low-pass filtering to the detected signal to produce a control signal on the signal line 40 connected to the second input terminal of the linear multiplier 32 to maintain the amplitude of the oscillation signal at a constant level.

The oscillator design of FIG. 2 keeps all of the components within their linear operating ranges. It does this by using a wideband analog multiplier 32 in the oscillator feedback to control loop gain. The multiplier 32 allows adjustment of loop gain electrically without allowing the active components to clip or to saturate. The control signal for the multiplier is derived from the amplitude of the buffer amplifier output signal so that when the loop gain is too high, the amplitude of the oscillation signal begins to rise causing the control signal to the multiplier 32 to drop which decreases loop gain to avoid signal clipping or active device saturation.

The advantages of this approach are numerous. Linear analysis techniques may be used to predict circuit performance under various conditions. The crystal output current is amplitude controlled with the amplitude control being as precise as required by setting the AGC loop gain. No undesired harmonics are generated and phase shift is predictable and stable. The ability to use linear analysis allows the use of performance analysis techniques that are not applicable to old designs using nonlinear circuits. Bode plots, root locus and control systems theory can easily and accurately model the operation of this new oscillator design because the precise amplitude control of the crystal output signals ensures that the amplitude of the crystal oscillation current remains constant. This is an important feature because the parameters of a crystal can shift due to a change in the physical amplitude of the oscillation signal. This approach permits performance parameters to be analyzed and adjusted to meet the requirements of a specific application unlike the prior art nonlinear crystal oscillator designs which were difficult to analyze and predict.

Since all circuit components operate in linear modes, the oscillation signal is a sine wave at every node in the loop and no undesired harmonics are generated. This reduces self-generated errors, simplifies cancellation of the crystal shunt capacitance $C_o$, and reduces crosstalk to other nearby electronic circuits.

Phase stability allows accurate and stable oscillations, particularly when using low Q crystals. Low Q crystals are crystals which are damped to have relatively high losses. Typical low Q crystals have Q's less than fifty thousand, while a high Q crystal might have a Q in excess of one million. One particular application of low Q crystal oscillator circuits is in vibratory angular rate sensing systems where information about the angular rate of motion of a craft is input to navigation and inertial guidance systems. Resonant sensors employing low Q piezoelectric crystal elements are incorporated in oscillator circuits which change frequency when subjected to acceleration forces. It should be appreciated that extreme accuracy is required for such navigation and guidance systems and that non-linear effects can seriously limit the accuracy of such systems. Similar low Q crystals may be used in force, pressure, weight, viscosity, temperature, timekeeping or other types of sensors.

Figure 3A:
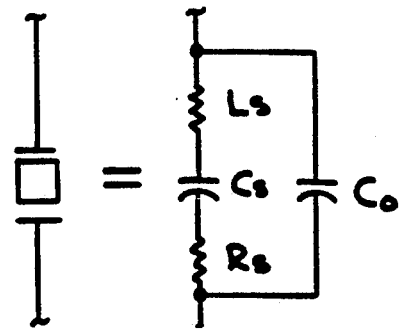
FIG. 3A is a diagram of an equivalent circuit for a crystal resonator, including the shunt capacitance $C_o$.

FIG. 3A shows the equivalent circuit for a piezoelectric crystal. One leg of the equivalent circuit includes a series inductance $L_s$, a series resistance $R_s$, and a series capacitance $C_s$. In parallel with the series leg is a shunt capacitance $C_o$. The shunt capacitance $C_o$ of the crystal produces a phase error. Ignoring $C_o$ at its resonance frequency, the crystal impedance is equal to the series resistor $R_s$. The capacitive reactance of $C_o$ at resonance combines with $R_s$ to produce a composite capacitive impedance. If the reactance of $C_o$ at resonance is not very much greater than $R_s$, the composite impedance will cause a significant phase shift which will also cause a change in the frequency of the oscillator circuit.

Figure 3B:
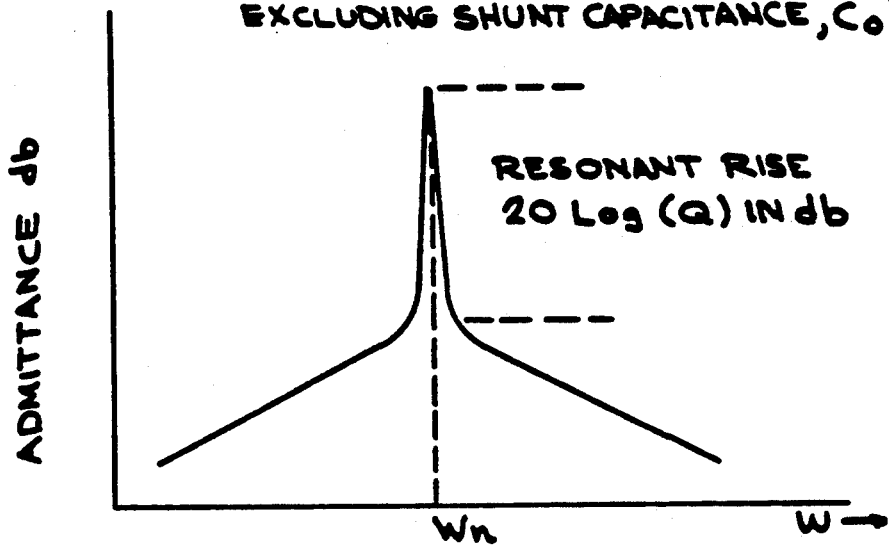
FIG. 3B is a plot of admittance versus angular frequency of a crystal resonator, excluding the effect of the shunt capacitance of the crystal.

FIG. 3B shows the magnitude of the admittance characteristic for the series leg of the crystal, which includes $L_s$, $C_s$, and $R_s$ but excludes the shunt capacitance $C_o$. The admittance is proportional to the current through the crystal for a given voltage and frequency. At the natural resonance angular frequency, the admittance and the crystal current are at a maximum value which is proportional to the Q of the crystal.

Figure 1:
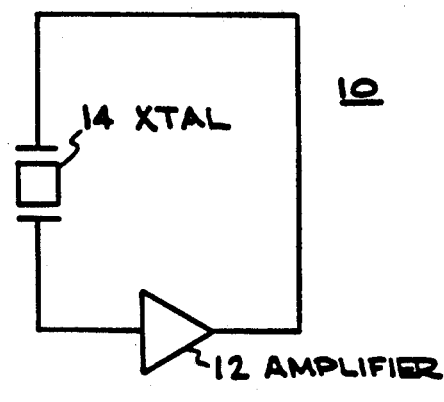
FIG. 1 is a circuit diagram of a prior-art basic series feedback crystal oscillator circuit.
Figure 3C:
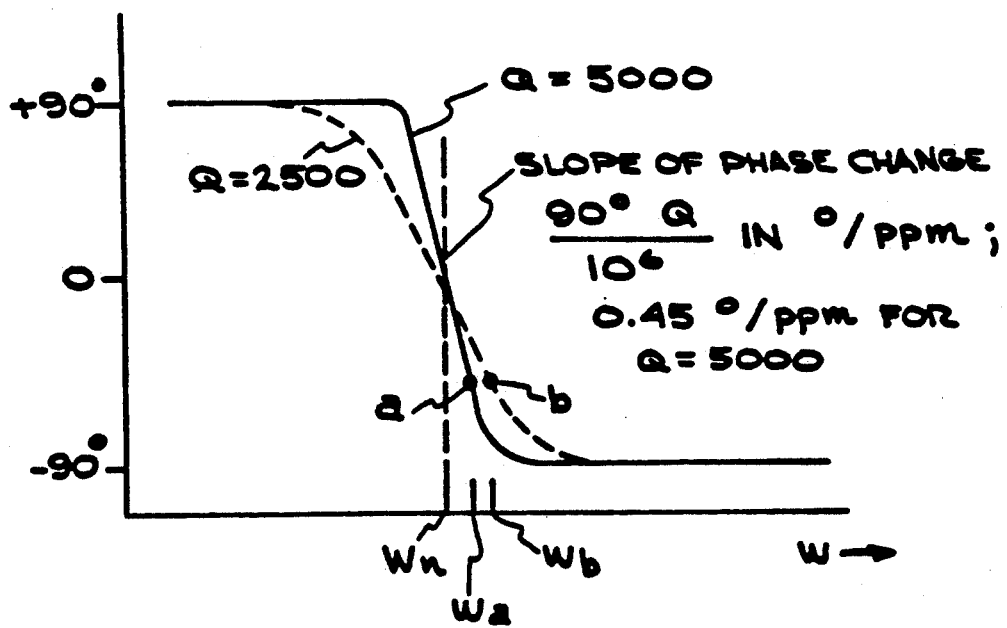
FIG. 3C is a plot of phase versus angular frequency of a crystal resonator excluding the effect of shunt capacitance.

FIG. 3C shows the phase of the admittance characteristic. Below the resonance frequency, the series capacitance of the crystal dominates and the admittance has a phase angle approaching $+90°$. Above the resonance frequency, the series inductance dominates and the admittance has a phase angle approaching $-90°$. At the series resonant frequency, the capacitive and inductive admittances cancel and the phase angle of the admittance is $0°$. In a series feedback oscillator circuit such as shown in FIG. 1, the net phase shift around the circuit must be $0°$. The shunt capacitance $C_o$ of the crystal introduces a phase shift error for which the circuit will compensate by shifting the oscillation frequency away from the natural resonant frequency of the crystal to a frequency at which the series leg of the crystal produces a phase angle opposite to the phase shift caused by the shunt capacitance, and at which the composite phase shift is $0°$.

The shape of the phase response is a function of the Q of the crystal. The approximate slope of the phase response curve of FIG. 3C in degrees per part-per-million is $90°Q/10^6$. For a Q of 5000, the slope is $0.45°$/ppm, as represented by the solid curve. For a Q of 2500, the slope is $0.225°$/ppm, as represented by the dashed curve.

Low-Q vibrating beam crystal oscillators are used as acceleration-to-electrical frequency transducers. These oscillators provide roughly a 10% change in frequency.

As the resonant frequency of the crystal is varied over this frequency range, the crystal and its mounting structure passes through various mechanical resonances due to the characteristics of the crystal and its mounting structure. These resonances draw energy from the vibrating crystal and, in effect, change the Q of the crystal at those resonances. If the crystal is not operating at zero degrees phase shift, such as at point 'a' on the $Q=5000$ curve, with an oscillation frequency $\omega_a$, a change in Q to the $Q=2500$ curve changes the crystal operating point to point 'b' with an oscillation frequency $\omega_b$. An oscillator circuit using a crystal can be used to sense a change in frequency to measure a variable such as acceleration, temperature, pressure, etc. Additionally, other types of sensors depend upon precise measurement of amplitude variations. The control signal can be used as a measure of such amplitude variations. Certain precision systems such as accelerometers, temperature sensors, and pressure transducers encode a variable as a frequency shift and require frequency stability in the range of 0.1 to 1 ppm. For a Q of 5000, a 0.1 ppm frequency shift is produced by a $0.005°$ phase shift. Therefore, it is necessary to avoid any phase shift change which arises from a change in the Q of the crystal at various resonant frequencies. This is accomplished by forcing the crystal to operate at its zero degrees phase shift frequency as described hereinbelow.

Figure 4A:
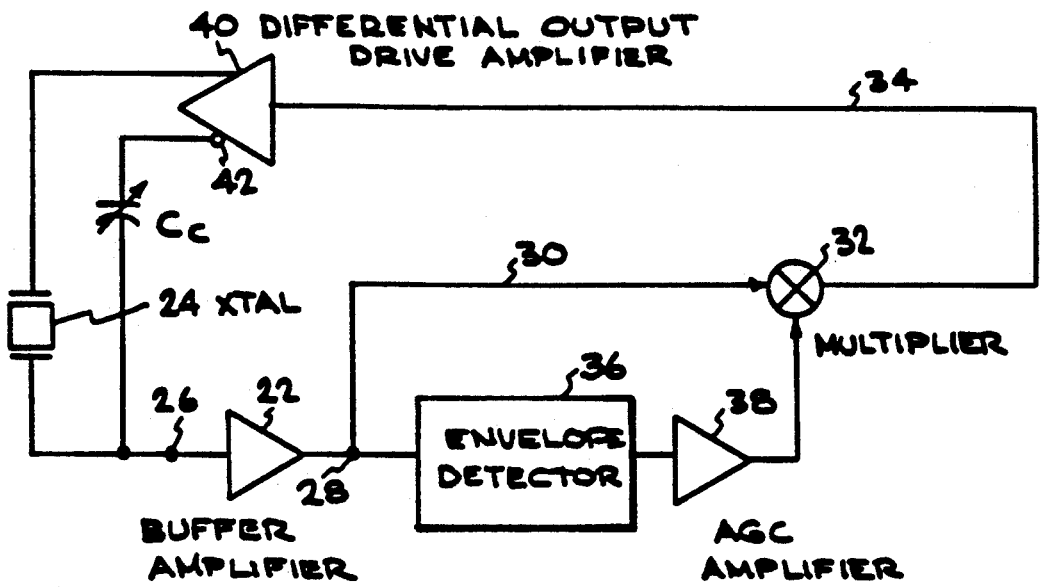
FIG. 4A is a block diagram of an embodiment of an oscillator circuit according to the invention with a compensation capacitor for cancelling the effect of shunt capacitance in a crystal resonant element.

FIG. 4A shows a $C_o$ cancellation circuit for the oscillator of FIG. 2. The circuit uses an inverted drive signal from a differential amplifier 40. A differential amplifier is defined as an amplifier which provides a non-inverted output signal and an inverted output signal at respective output terminals, each having the same characteristics such as source impedance, frequency response, phase delay, etc. Differential amplifiers are commonly available as video amplifiers having inverted and non-inverted output signals. Differential amplifiers are constructed so that the inverted output signal and the non-inverted output signals are precisely equal in magnitude and opposite in phase. The inverted drive signal is provided at an output terminal 42 and passes through a cancellation capacitor $C_c$ to inject a current of equal magnitude and opposite sign from the $C_o$ current into the input terminal 26 of the buffer amplifier 22. This effectively cancels the effect of the $C_o$ current. The phase of the inverted signal at terminal 26 must be correct so that the two currents precisely cancel. The magnitude of the inverted signal from the inverted output terminal 42 is not critical since the value of $C_c$ can be adjusted to compensate. The differential output drive amplifier 40 is used to get better phase matching. The effect of using the compensation capacitor $C_c$ is to cancel $C_o$ and operate the crystal at its 0 degree phase angle to avoid the effect of variations in Q.

Figure 4B:
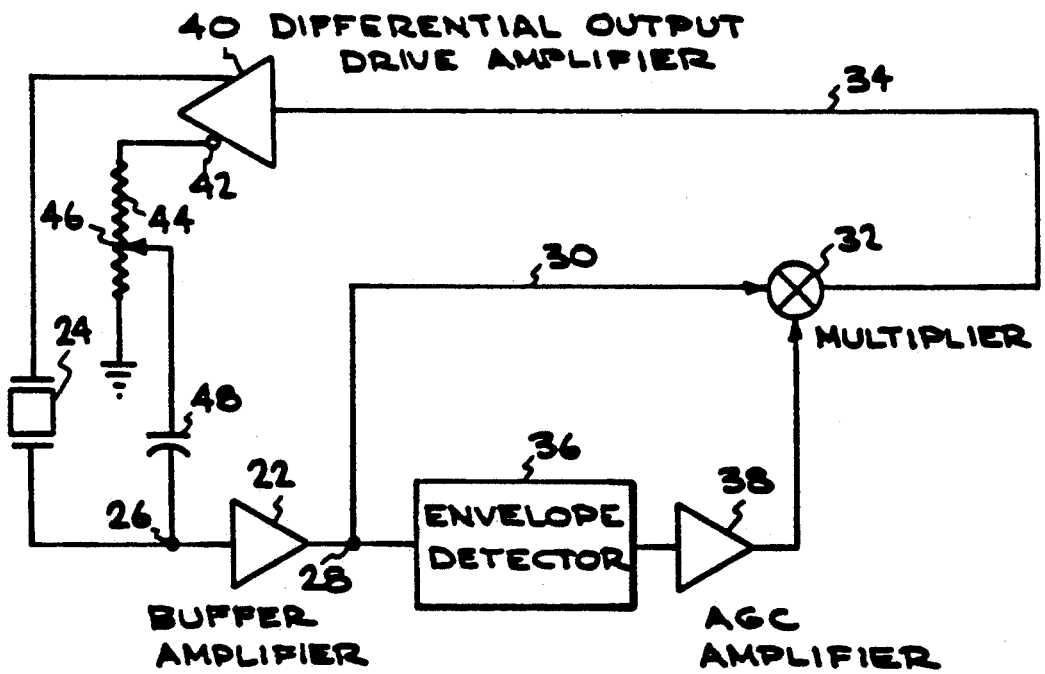
FIG. 4B is a block diagram of an embodiment of an oscillator circuit according to the invention with a voltage divider circuit in conjunction with a compensation capacitor for cancelling the effect of shunt capacitance in a crystal resonant element.

FIG. 4B shows a variable resistive voltage divider 44 connected to a ground reference voltage and to the terminal 42. The tap 46 of the voltage divider is connected to one end of a coupling capacitor 48 and the other end of the coupling capacitor 48 is connected to the input terminal 26 of the buffer amplifier 22.

Figure 4C:
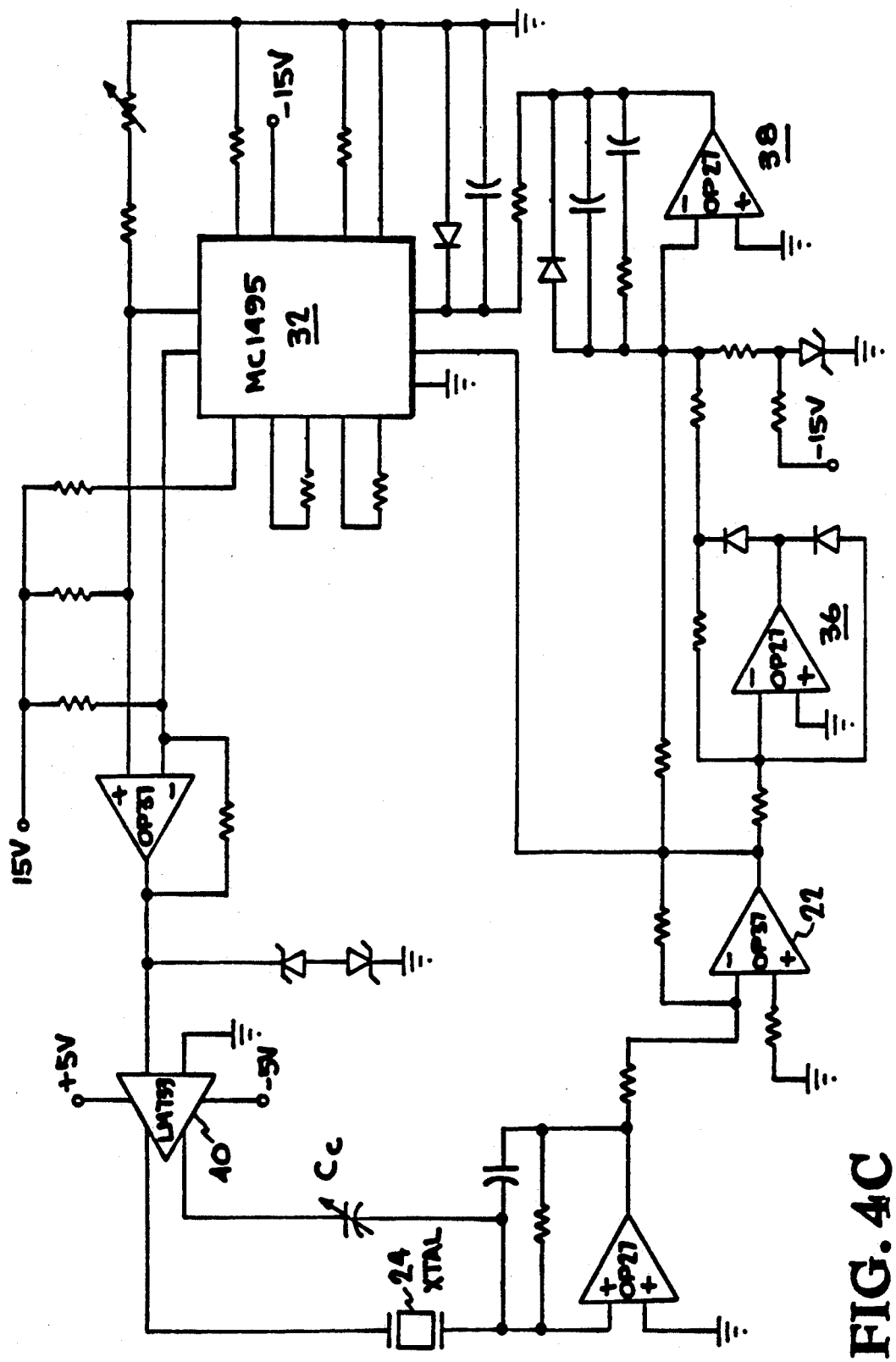
FIG. 4C is a detailed circuit diagram of the oscillator circuit as shown in FIG. 4A.

FIG. 4C shows some of the details of a specific embodiment of the series feedback crystal oscillator shown diagrammatically in FIG. 4A.

Figure 5:
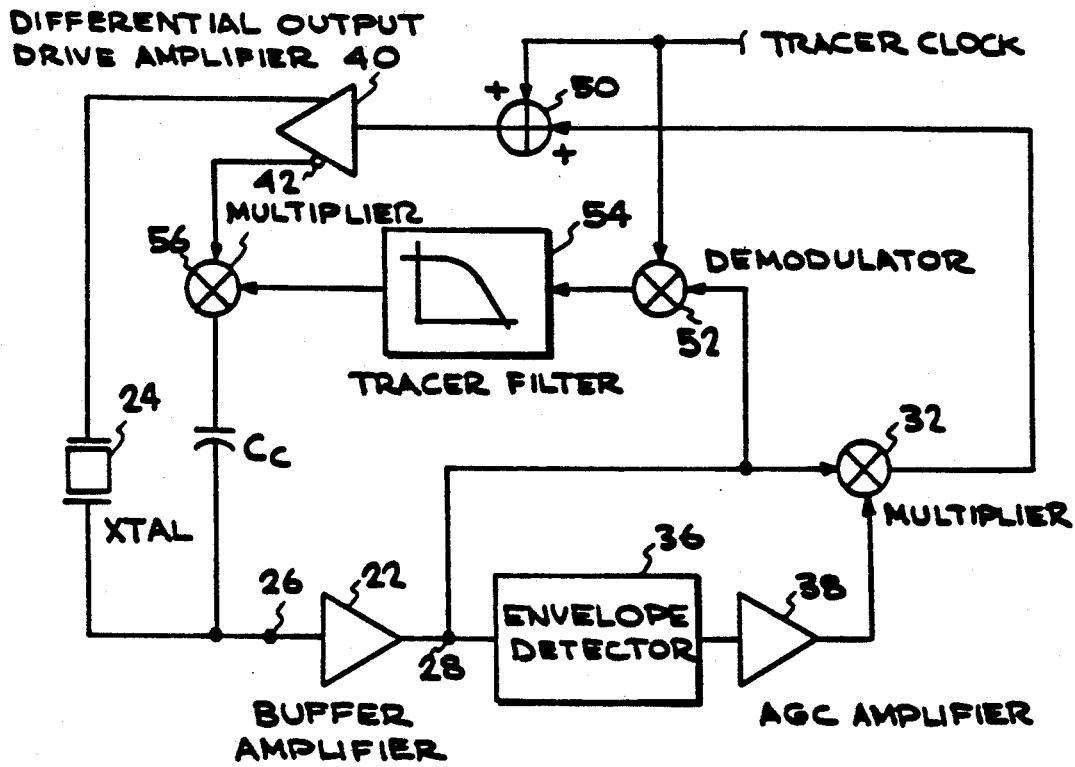
FIG. 5 is a block diagram of an embodiment of an oscillator circuit according to the invention with a circuit for cancelling the effect of shunt capacitance in a crystal resonant element.

FIG. 5 shows a system for automatically compensating for the $C_o$ component of the crystal 24. The shunt capacitance cancellation circuit of FIG. 4A allows improved oscillator stability but requires manual adjustment of the cancellation capacitor. The circuit is modified as shown in FIG. 5 to provide a means for electrically trimming the signal through the cancellation capacitor. The circuit shown in FIG. 5 requires a tracer signal which is injected into a summer 50 which is positioned in the signal path just before the differential drive amplifier 40. The tracer signal frequency may be above or below the oscillator frequency, but should not be near any of the crystal overtone resonant frequencies. The tracer signal passes through $C_o$ of the crystal and is cancelled by the signal through $C_c$ when the adjustment is correct. Any deviation from perfect cancellation causes some residual tracer signal to appear at the output of the buffer amplifier 22. This signal is synchronously demodulated in the demodulator circuit 52 using the tracer signal. The resultant signal then is low-pass filtered by an integrator circuit 54 to produce a control signal which is used to readjust the level of the signal through $C_c$ using a linear multiplier circuit 56.

Figure 6:
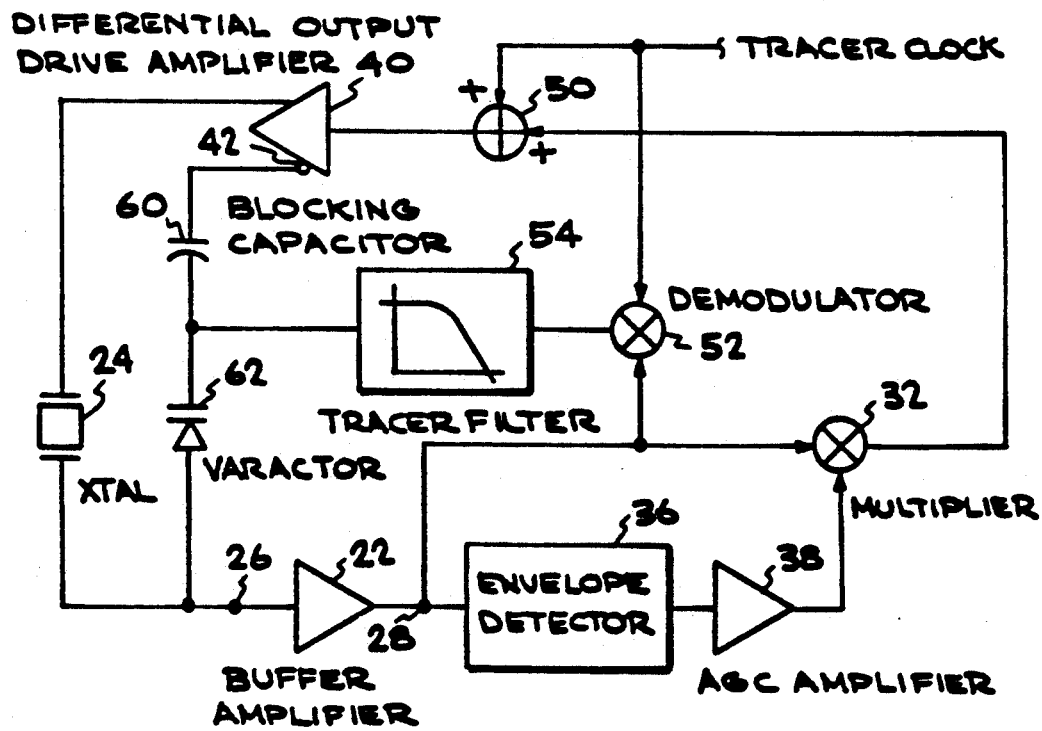
FIG. 6 is a block diagram of an embodiment of an oscillator circuit according to the invention with a varactor circuit for cancelling the effect of shunt capacitance in a crystal resonant element.

FIG. 6 shows an alternative method of varying the $C_o$ compensating signal to the input mode 26 of the buffer amplifier 22. The control signal from the lowpass filter 54 is fed to the junction of a series blocking capacitor 60, which is connected to the inverting output terminal 42 of the differential amplifier 40, and a varactor 62. The capacitance value of the varactor 62 is automatically adjusted to null the tracer signal.

Some applications require the use of two crystal oscillators operating at very close frequencies. The oscillators may experience crosstalk where the signal of one oscillator feeds through to the other by way of parasitic capacitances. This can cause one oscillator to "pull" the frequency of the other, that is, cause the second oscillator to operate at an off-resonance frequency. If the frequencies are close enough and the parasitic crosstalk high enough, the oscillators will "lock" and both will operate at the same frequency somewhere between the two resonant frequencies.

Figure 7:
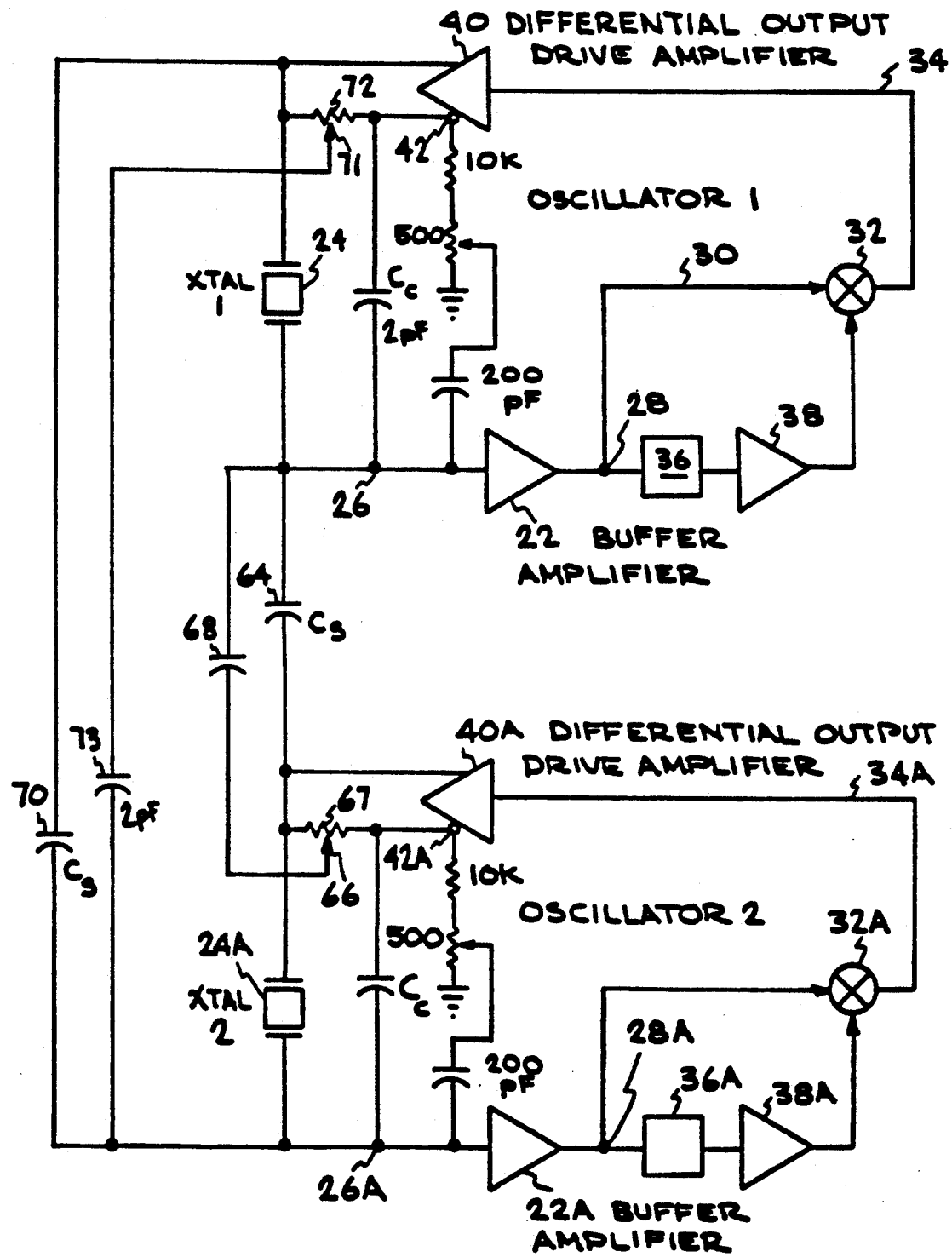
FIG. 7 is a circuit diagram of an embodiment of an oscillator system according to the invention with a circuit for compensating for crosstalk between two crystal oscillator circuits.

FIG. 7 shows a crosstalk cancellation circuit which injects a signal into one oscillator from the other oscillator. The injected signal is the inverse of the parasitic crosstalk signal. This cancels to a great extent the parasitic signal and greatly reduces the tendency of the first oscillator to "pull" and incorrectly "lock." The components of the one oscillator are the same as those shown in FIG. 4A while the components of the second oscillator are designated with an A suffix to the reference numerals to indicate similar components.

The parasitic capacitance $C_s$ feeding signals from the second oscillator is represented as a capacitor 64 connected between the noninverting terminal of the differential drive amplifier 40A and terminal 26 which is a virtual ground for the operational amplifier forming the buffer amplifier 22. The effect of this parasitic signal is cancelled by feeding a signal from a tap point 66 on a resistor 67 connected between the inverting and noninverting output terminals of the differential amplifier 40A. The tap point 66 is adjusted to feedback an oppositely-phased signal through a capacitor 68 from the second oscillator circuit to the input terminal of the buffer amplifier 22 of the first oscillator circuit.

Similarly, interference signals coupled to the second oscillator circuit from the first oscillator circuit through a possible capacitor $C_s$ represented as capacitor 70 are cancelled. An oppositely-phased signal from the first oscillator is coupled through a capacitor 73 from a tap 71 on a variable resistor 72, which is connected between the inverting and noninverting terminals of the differential amplifier 40.

Figure 8:
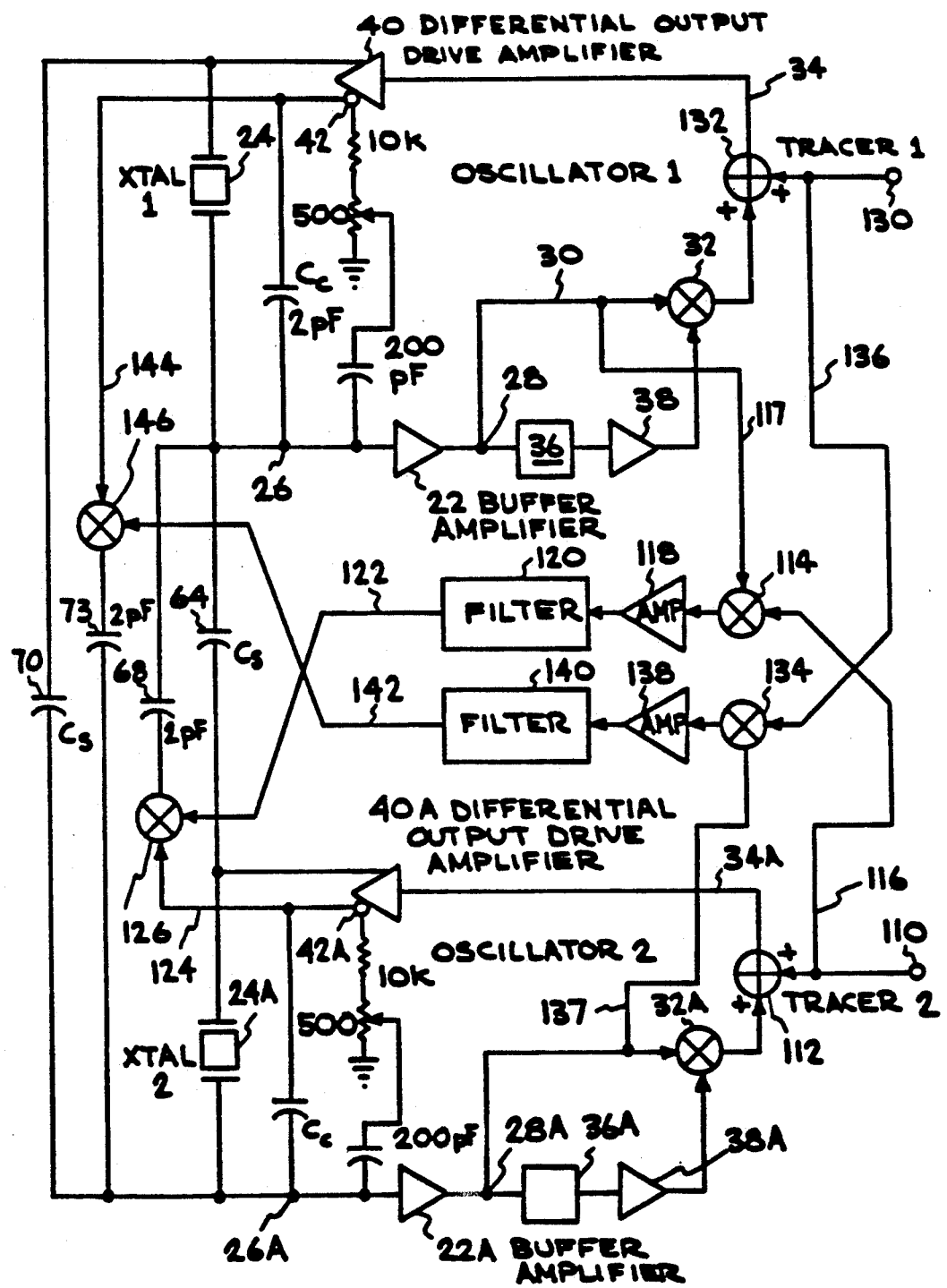
FIG. 8 is a circuit diagram of another embodiment of an oscillator according to the invention with crosstalk cancellation.

FIG. 8 shows an automatic crosstalk cancellation circuit which automatically injects a correction signal into one oscillator from the other oscillator. The injected correction signal is the inverse of the parasitic crosstalk signal. The essential components of oscillator 1 and of oscillator 2 are the same as those shown in FIG. 7.

The parasitic capacitance $C_s$, represented by capacitor 64, feeds a signal from the second OSCILLATOR 2 to the virtual ground terminal 26 for the operational amplifier forming the buffer amplifier 22 of the first OSCILLATOR 1. To cancel the effect of the parasitic signal from OSCILLATOR 2 into OSCILLATOR 1, additional circuitry is provided for automatic cancellation using a TRACER 2 signal provided at a terminal 110. The TRACER signal is injected into the series-feedback signal line 34A using a summer circuit 112 as shown in the drawing. The TRACER signal is parasitically coupled from the OSCILLATOR 2 circuit to the OSCILLATOR 1 circuit, so that the amount of TRACER 2 signal found in the OSCILLATOR 1 circuit provides an indication of the amount of oscillator signal itself being parasitically coupled. In order to detect the amount of TRACER 2 signal present in the OSCILLATOR 1 circuit a multiplying detector 114 is provided which has one input terminal coupled to a signal line 116 from the input terminal 110 for the TRACER 2 signal. The other input terminal of the multiplying detector 114 is coupled to a signal line 117 from the signal line 30 of OSCILLATOR 1, as shown in the drawing. The output signal of the multiplying detector 114 is fed through an amplifier circuit 118 and a lowpass filter 120 to provide a control signal on a signal line 122. A correction signal from OSCILLATOR 2, having an opposite phase from the interfering signal is provided from a terminal 42A of OSCILLATOR 2 through a signal line 124 to an input terminal of a linear multiplier 126, which has another input terminal for receiving the control signal on the signal line 122. The correction output signal of the multiplier 126 is passed through the coupling capacitor 68 to the virtual-ground terminal 26 of the OSCILLATOR 1. If the amount of TRACER 2 signal as detected in OSCILLATOR 1 varies, the control signal on signal line 122 varies to provide a proper amount of cancellation signal through the multiplier 126. This circuit therefore functions to automatically cancel the interference from OSCILLATOR 2 parasitically coupled to the circuit of OSCILLATOR 1.

In a similar manner, interference signals from OSCILLATOR 1 are cancelled in OSCILLATOR 2. A TRACER 1 signal is provided on an input terminal 130. Terminal 130 is coupled to one input terminal of a summer 132 Which is inserted in series with the feedback signal line 34 of OSCILLATOR 1, as shown. The TRACER 1 signal from terminal 130 is also coupled through a signal line 136 to one input terminal of a multiplying detector 134. The other input terminal of the detector 134 receives a signal on a signal line 137 from the OSCILLATOR 2 as shown. The output signal of the multiplier 134 is amplified by an amplifier 138 and filtered in a lowpass filter 140 to provide a control signal on a signal line 142 for a multiplier circuit 146. The multiplier circuit 146 receives an oppositely phased cancellation signal from OSCILLATOR 1 on a signal line 144. The output signal of the multiplier 146 is fed through a capacitor 73 to the virtual-ground input terminal 26A of OSCILLATOR 2 as shown. The circuitry provides for automatic cancellation of signals parasitically coupled from OSCILLATOR 1 into OSCILLATOR 2.

Figure 9:
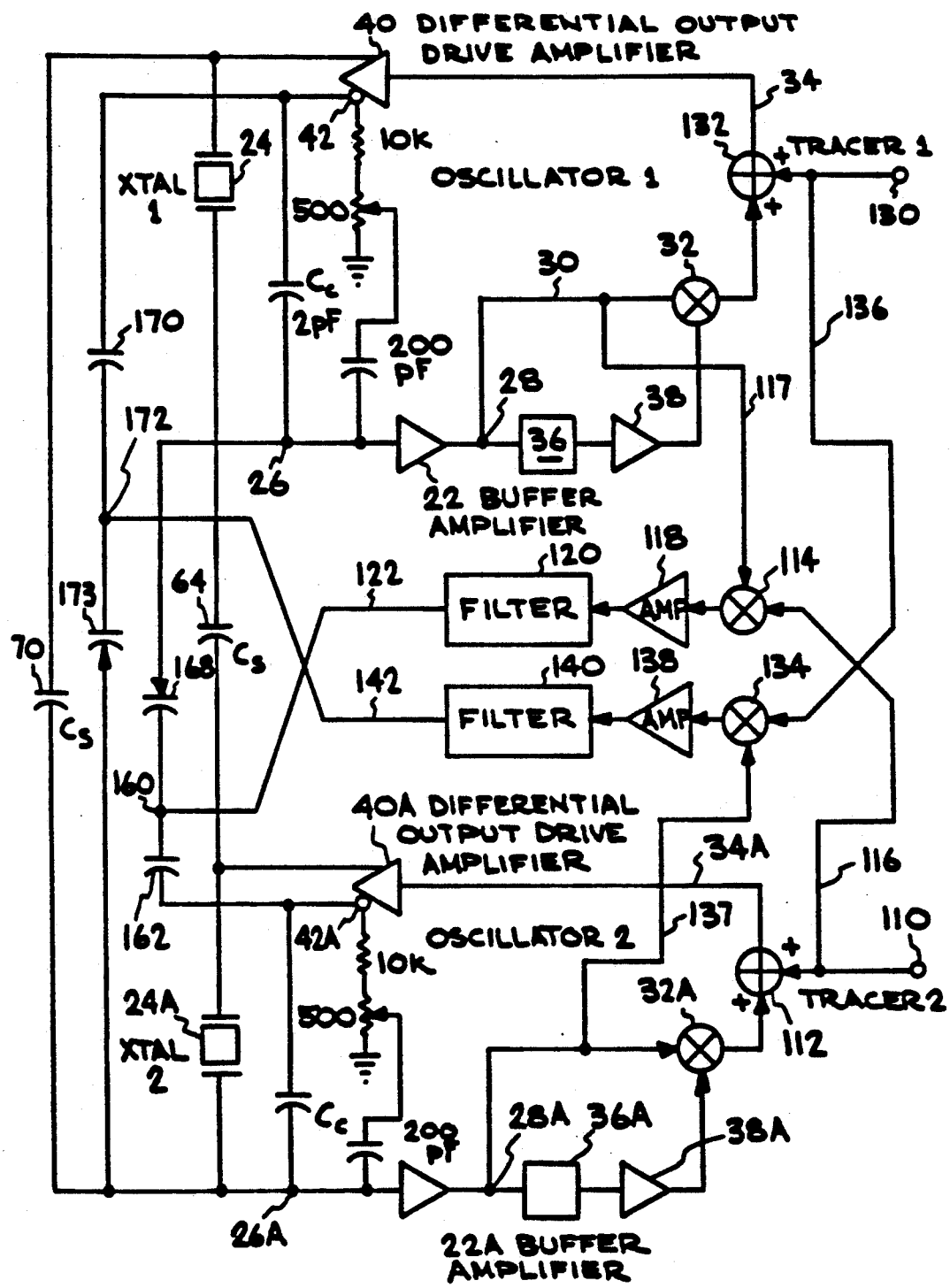
FIG. 9 is a circuit diagram of an oscillator system according to the invention with a crosstalk cancellation circuit using varactors as gain-control elements.

FIG. 9 shows a circuit for automatically cancelling crosstalk using varactors 168, 173 as gain-controlled elements used for automatically controlling the amount of cancellation signal coupled from the source of interference to the OSCILLATOR being interfered with. This circuit is similar to that of FIG. 8 except for the use of varactors as gain-controlling elements for the cancellation signals. The control signal on signal line 122 for controlling the amount of correction signal from OSCILLATOR 2 to OSCILLATOR 1 is connected to a terminal 160. A coupling capacitor 162 couples a correction signal from the inverting output terminal 42A of the drive amplifier 40A of OSCILLATOR 2 to terminal 160. A varactor 168 is connected between the terminal 160 and the virtual-ground input terminal 26 of the OSCILLATOR 1 buffer amplifier 22, as shown. Variation in the level of the control signal on signal line 122 changes the capacitance of the varactor 168 to vary the level of correction signal injected from OSCILLATOR 2 into OSCILLATOR 1. In a similar manner a coupling capacitor 170 provides an automatically adjusted correction signal from OSCILLATOR 1 to a terminal 172. Terminal 172 has a control signal provided on signal line 142. A varactor 173 is connected between the terminal 172 and the virtual-ground input terminal 26A of the buffer amplifier 22A, to provide automatic cancellation of interfering signals.

Figure 10:
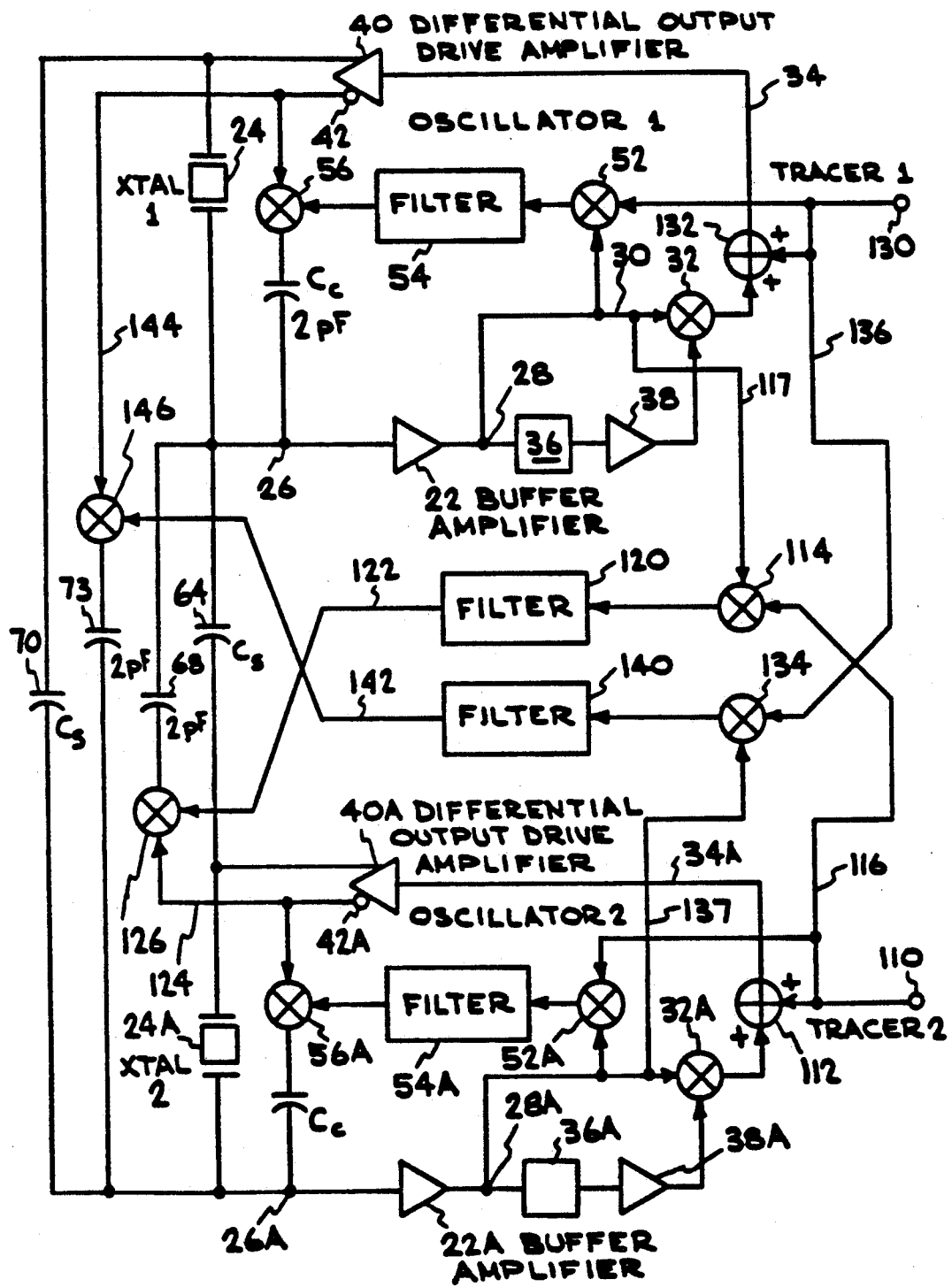
FIG. 10 is a circuit diagram of an embodiment of an oscillator system according to the invention with circuits for cancelling the effect of shunt capacitance in a crystal resonant element and for cancelling crosstalk between oscillator circuits.

FIG. 10 shows circuits for automatically controlling cancellation of the shunt capacitances of the crystals 24, 24A and for automatically controlling crosstalk cancellation between OSCILLATOR 1 and OSCILLATOR 2. This circuit combines the functions of FIG. 9 and of FIG. 5, where the functions of FIG. 5 are duplicated in FIG. 10 by elements suffixed with the letter A. As a result, one TRACER signal is used in connection with each of the OSCILLATORS to provide for both shunt capacitance cancellation and for tracing parasitic coupling of an OSCILLATOR into the other OSCILLATOR.

Figure 11:
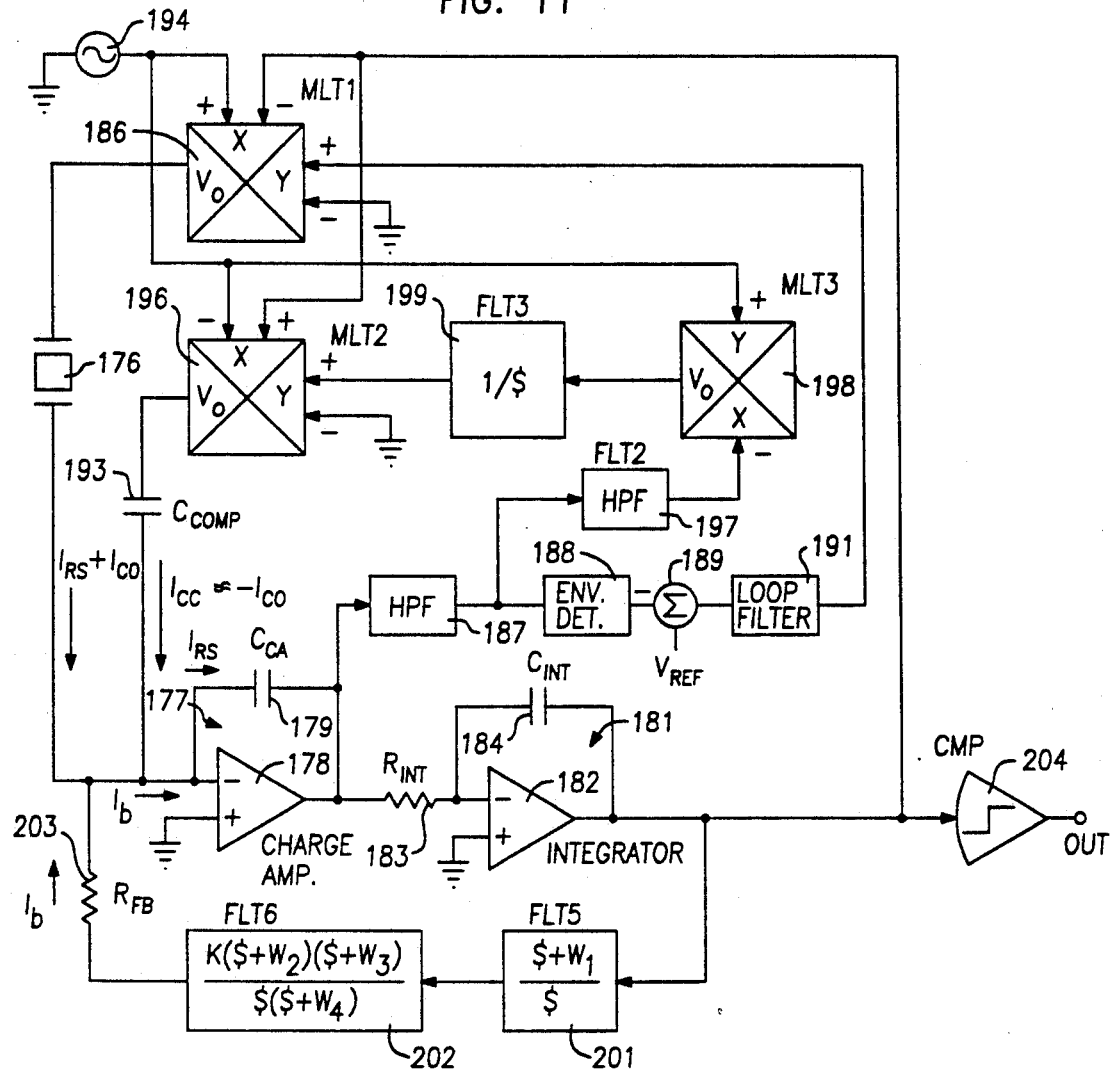
FIG. 11 is a block diagram of an embodiment of an oscillator according to the invention with a charge amplifier and an integrator in the feedback loop.

In the embodiment of FIG. 11, a crystal 176 is connected to the input of a charge amplifier 177 which is illustrated as comprising an operational amplifier 178 with a feedback capacitor 179 connected between the output and the inverting input of the amplifier. This amplifier, in effect, converts the current from the crystal to a voltage and integrates the voltage to provide an output voltage corresponding to the inverted and integrated current, or charge, from the crystal.

The output of the charge amplifier is connected to the input of an integrator 181 which is illustrated as comprising an operational amplifier 182 having an input resistor 183 and an integrating capacitor 184 connected between the output and the inverting input of the amplifier. The signal at the output of the integrator is a voltage corresponding to the inverted integral of the voltage at the output of the charge amplifier.

The output of the integrator is connected to one input of a multiplier 186, the output of which is connected to crystal 176 to provide an excitation voltage for the crystal. The integrator signal is applied to a negative input of the multiplier, and the multiplier thus serves as an inverter which provides 180° of phase shift which, combined with the −90° phase shift which the charge amplifier and the integrator each provide (in addition to the 180° shift in each due to their inverting configuration), results in a net phase shift of 0° around the loop formed by the charge amplifier, the integrator, the multiplier and the crystal. The circuit thus oscillates at the series resonant frequency of the crystal, e.g. 10 KHz.

In order to prevent the oscillator from running away, the gain around the loop is maintained at a level of unity. This is done by applying a control voltage to the multiplier to adjust the level of the driving voltage applied to the crystal to maintain unity gain. The control signal is derived from the voltage at the output of the charge amplifier by a high pass filter 187, an envelope detector 188, a summation network 189 and a loop filter 191. Filter 187, which is connected to the output of the charge amplifier, operates in the transition region between its stop and pass bands and serves as a differentiator which offsets the effect of the integration implied in the charge amplifier so that the signal from the filter corresponds to the current through the crystal, which makes the current and hence the physical amplitude of the crystal uniform regardless of the frequency at which the crystal is operating.

The envelope detector is connected to the output of the high pass filter and can be of any suitable design for providing a DC signal corresponding to the level of the signal from the filter. In one presently preferred embodiment, the envelope detector comprises a full-wave rectifier.

The output of the envelope detector is connected to a negative input of the summation network 189 where the detector signal is subtracted from a reference voltage $V_{REF}$ to provide an error signal. The error signal is passed through filter 191 which serves as a compensation filter and sets the characteristics of the AGC loop, and the output of this filter is connected to a control input of the multiplier. The input to which the control signal is applied is a positive input, so the driving voltage varies inversely with the envelope of the carrier voltage at the output of the charge amplifier to offset any changes in the gain of the oscillator loop. In the embodiment illustrated, multiplier 186 is a two quadrant multiplier which has positive and negative x- and y-inputs, with the output of the multiplier being the product of the differences in the voltages applied to the two sets of inputs, i.e.

$$V_o = (V_{+x} - V_{-x})(V_{+y} - V_{-y}),$$

where $V_{+x}$, $V_{-x}$ are the voltages at the positive and negative x-inputs, and $V_{+y}$, $V_{-y}$ are the voltages at the positive and negative y-inputs. In the example given, the oscillator signal is applied to the −x input, and the control signal is applied to the +y input. The quantity $(V_{+y} - V_{-y})$ is not allowed to be negative, which restricts the operation of the multiplier to two quadrants.

As in the previous embodiments, compensation is provided for offsetting the effects of shunt capacitance in the crystal to prevent parasitic oscillation from impairing the operation of the oscillator at the desired frequency. In this regard, a compensation capacitor 193 is connected to the input of charge amplifier 177 in parallel with crystal 176, and tracer signals of opposite phase are applied to the crystal and to the compensation capacitor so that any current due to the shunt capacitance is effectively cancelled.

The tracer signals are provided by a local oscillator 194 at a frequency substantially higher than the carrier frequency of the main oscillator so that the shunt capacitance will be the dominant impedance of the crystal at the tracer frequency. In a oscillator designed for operation at 10 KHz, for example, the tracer signals might have a frequency of over 100 KHz.

The tracer signal is applied to the crystal through the +x input of multiplier 186 and to the compensation capacitor through a negative input of a multiplier 196 which is similar to the first multiplier. In order for the cancellation of the shunt capacitance to be effective at the operating frequency of the oscillator (e.g., 10 KHz) as well as the tracer frequency (e.g., 800 KHz), the two multipliers should both have a broadband response and should be closely matched in operating characteristics. In multiplier 196, the tracer signal is applied to the −x input and is subtracted from the oscillator carrier signal which is applied to the +x input.

The gain of multiplier 196 and hence amount of tracer signal applied to the compensation capacitor is controlled by a compensation loop which includes high pass filter 187 and a second high pass filter 197 which is cascaded with filter 187. The function of the two filters in the compensation loop is to pass any residual tracer signal at the output of the charge amplifier and to block the carrier signal.

The amplified residual tracer signal from the second high pass filter is connected to the $-x$ input of a four quadrant multiplier 198, where it is multiplied by the tracer signal which is applied to the $+y$ input of the multiplier. The output of multiplier 198 is connected to the input of a filter 199, which in the embodiment illustrated comprises an integrator, and the output of this filter is connected to the $+y$ input of multiplier 196.

The current supplied to the charge amplifier by the crystal is $I_{RS}+I_{Co}$, where $I_{RS}$ is the series resonant current and $I_{Co}$ is the current through the shunt capacitance. The current supplied to the charge amplifier by the compensation capacitor is $I_{CC}=-I_{Co}$, which balances the current due to the shunt capacitance and thus cancels the effect of that capacitance. Biasing current $I_b$ is supplied to the charge amplifier by a feedback loop of a type which is sometimes referred to as a "washout" loop connected between the output of the integrator and the input of the charge amplifier. This loop includes filters 201, 202 and a resistor 203. Filter 201 has a zero at $\omega_1$ and a pole at DC, and filter 202 has zeros at $\omega_2$ and $\omega_3$ and poles at $\omega_4$ and at DC, with the transfer functions indicated in the drawing. This loop replaces the bias current lost in the charge amplifier without introducing any phase shift errors. It also functions to reduce the gain of the main oscillator loop at frequencies below the desired operating frequency $f_0$ where any mismatch of $I_{CO}$ and $I_{CC}$ could be amplified by the charge amplifier and integrator and thereby create potential instability.

A comparator 204 is connected to the output of integrator 181 to convert the sinewave signal from the integrator to a squarewave output signal. A sinewave signal in quadrature with the output signal is available at the output of charge amplifier 177 and can also be converted to a squarewave, if desired.

Figure 12:
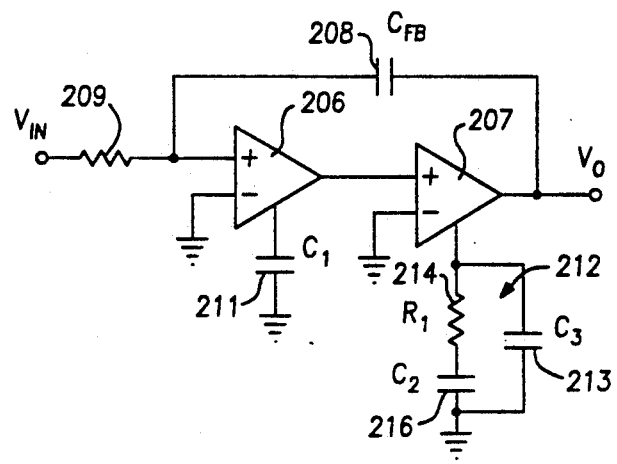
FIG. 12 is a circuit diagram of a circuit which can be used for both the charge amplifier and the integrator in the embodiment of FIG. 11.

FIG. 12 illustrates a circuit which can be utilized for both the charge amplifier and the integrator in the oscillator of FIG. 11. This circuit includes operational amplifiers 206, 207, with the output of amplifier 206 being connected to the noninverting input of amplifier 207, and a feedback capacitor 208 being connected between the output of amplifier 207 and the inverting input of amplifier 206. When the circuit is used as an integrator, an input resistor 209 is connected to the inverting input of amplifier 206. When the circuit is used as a charge amplifier, this resistor is omitted, and the input signals are applied directly to the inverting input of amplifier 206. A compensation network consisting of a single capacitor 211 is connected to amplifier 206, and a lead-lag compensation network 212 consisting of a capacitor 213 in parallel with a resistor 214 and a capacitor 216 is connected to amplifier 207.

Figure 13A:
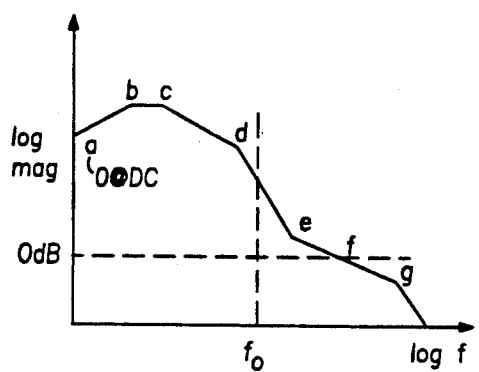
FIGS. 13A and 13B are graphical representations of the open loop magnitude and phase responses of the circuit of FIG. 12.
Figure 13B:
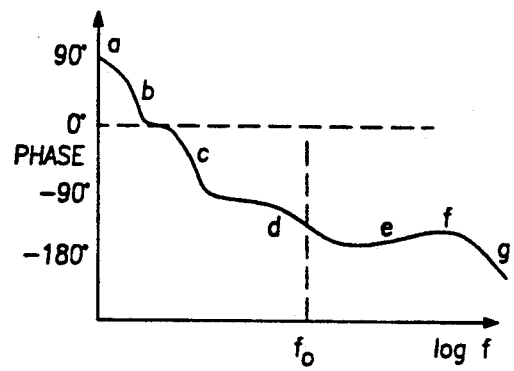

The open loop magnitude and phase responses of the circuit of FIG. 12 are shown in FIGS. 13A and 13B for a circuit having an operating frequency $f_0$ which can, for example, be on the order of 10 KHz. As illustrated, the circuit has a zero a at DC, poles b and c which are generated predominantly by compensation capacitors 211 and 216, a pole d which is due to the high pass filtering action of capacitor 208 and resistor 209, and a zero e and a pole g produced by the lead-lag network 212, with a 0 db crossing f approximately midway between zero e and pole g. The circuit has high open loop gain and an open loop phase shift which is very close to 180. at the operating frequency $f_0$, which makes it particularly well suited for use in the oscillator of FIG. 11.

Figure 14:
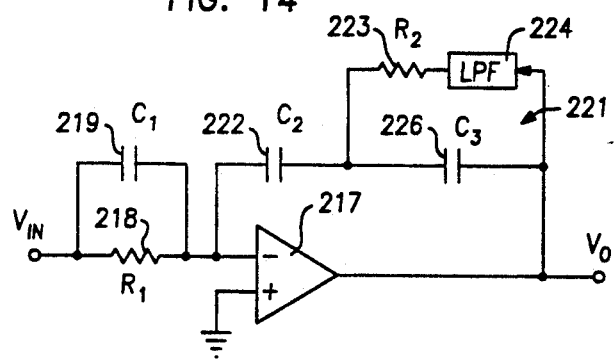
FIG. 14 is a circuit diagram of a filter which is particularly suitable for use in the embodiment of FIG. 11.
Figure 15A:
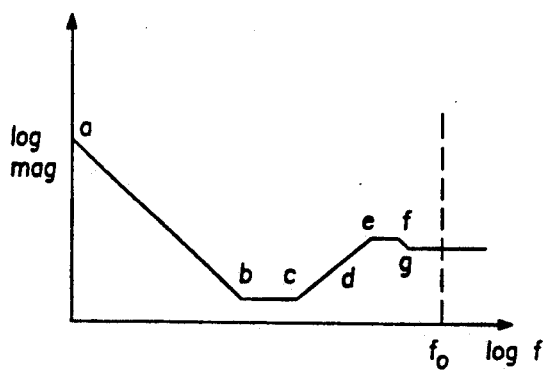
FIGS. 15A and 15B are graphical representations of the magnitude and phase response of the filter of FIG. 14.
Figure 15B:
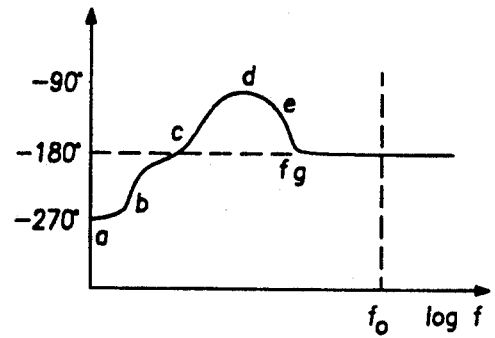

FIG. 14 illustrates a filter which is particularly suitable for use in the washout loop in the oscillator of FIG. 11, and the closed loop magnitude and phase response of this filter are shown in FIGS. 15A and 15B. This filter comprises an operational amplifier 217 having a parallel connected resistor 218 and capacitor 219 connected to the inverting input thereof. A lead-lag network 221 and a capacitor 222 are connected between the output and the inverting input of the amplifier. The lead-lag network comprises a series connected resistor 223 and low pass filter 224 in parallel with a capacitor 226.

This filter has a pole a at DC, a zero b produced by resistor 218 and capacitor 219, a zero c produced predominantly by resistor 223 acting with capacitor 222, a pole e produced by capacitor 226 acting with resistor 223, and a pole f and a zero g produced by low pass filter 224. Above zero g, where the operating frequency $f_0$ is located, the gain of the filter is substantially flat. The phase is $-270°$ at DC, rising above $-180°$ between zero o and zero g, and very close to $-180°$ above pole g. A filter having the transfer function shown for filter 202 in FIG. 11 has a similar response, except it does not have the pole at f and the zero at g.

In the oscillator of FIG. 11, it is important that precise phase relationships be maintained so that the net phase shift around the main oscillator loop will be exactly 0°, or very close to 0°. Accordingly, the amplifiers, filters, integrators and other circuits employed in the oscillator should all produce little or no phase error. This is particularly important with a crystal of relative low Q.

Figure 16A:
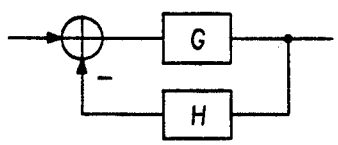
FIGS. 16A-16C illustrate a matching technique for reducing phase error in the circuits employed in the embodiment of FIG. 11.
Figure 16B:
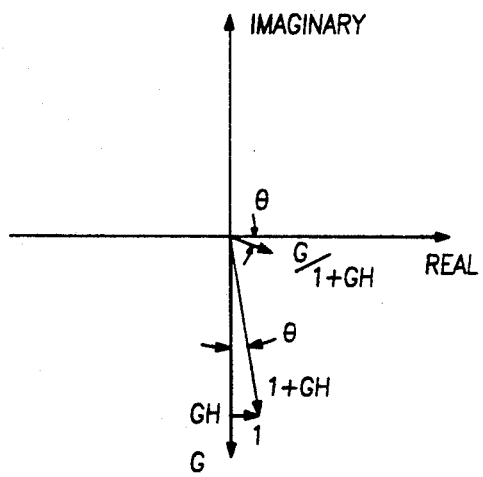
Figure 16C:
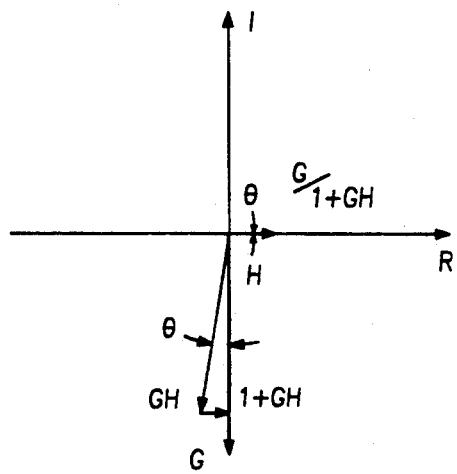
Figure 17A:
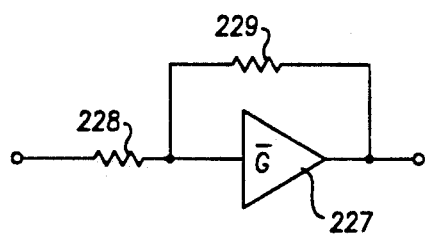
Figure 17B:
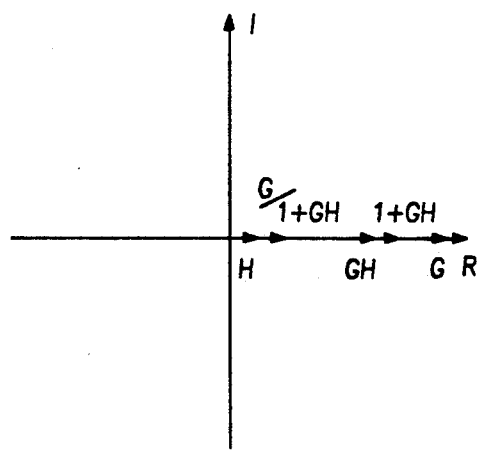

One technique for reducing phase error in the circuits employed in the oscillator is to provide phase shifts in the feedback loops of the circuits which are matched to the phase shifts in the forward direction. This technique is illustrated in FIGS. 16A-16C for a an overall gain $G/(1+GH)$. As illustrated in FIG. 16B, with no compensation, the vectors G and GH lie along the $-y$ axis, the vector H and the vector quantity 1 lie along the $+x$ axis, and the vector $1+GH$ is shifted from the $-y$ axis by the phase angle $\theta$. As long as the loop gain GH is high, the phase angle $\theta$ will be relatively small, but it will still cause the vector $G/(1+GH)$ to be shifted from the $+x$ axis. The phasor diagram of FIG. 16B is plotted for a single frequency $f_0$, and is typical where G represents the open loop gain and phase of an operational amplifier with 90° of lag at frequency $f_0$.

As illustrated in FIG. 16C, by making H have approximately the same phase shift as $G/(1+GH)$ when there is no compensation, the phase error can be eliminated, and the compensated $G/(1+GH)$ phasor will lie precisely along the $+x$ axis. Thus, in the example illustrated, H is given an angle $\theta$, and the vector product GH is displaced from the $-y$ axis by the angle 8. When 1 is added to this vector, the resulting $1+GH$ vector lies precisely on the $-y$ axis, and when G is divided by the $1+GH$ vector, the resulting $G/(1+GH)$ vector lies precisely on the $+x$ axis. For good matching, the phase shift of H can be implemented by using components which are similar to the components with which G is implemented. This technique depends on the matching of components in the forward and feedback loops and is subject to error with changes in component values with heat and aging.

A second technique for maintaining precise phase relationships in the oscillator circuits is illustrated in FIGS. 17A-17B and 18A-18B. In this technique, phase shifts of 0° and 180° are utilized to avoid phase errors. The circuit of FIG. 17A has a wideband amplifier 227, such as a video amplifier, having a substantially flat response and 0° phase shift from DC to about 1 MHz. An input resistor 228 is connected to the inverting input of this amplifier, and a feedback resistor 229 is connected between the output and the inverting input. The resistors form a voltage divider, the gain H of which is less than 1. The G, H and 1+GH vectors all lie along the +x axis, as does the overall gain G/(G+GH), and there is little or no phase error, particularly if the loop gain GH is high.

The circuit of FIG. 18A has a pair of cascaded operational amplifiers 231, 232, with a resistor 233 connected to the inverting input of amplifier 231. The output of amplifier 231 is connected to the noninverting input of amplifier 232 through a lead-lag network 234 which provides dynamic compensation and prevents oscillation at high frequencies. A feedback resistor 236 is connected between the output of amplifier 232 and the inverting input of amplifier 231, with resistors 233, 236 forming a voltage divider with a gain H of less than 1. Compensation capacitors 237, 238 are connected to the operational amplifiers. If desired, the two operational amplifiers and the lead-network between the same can be replaced with a single operational amplifier having two gain stages and second-order compensation. In this circuit, the forward gain G lies along −x axis, the feedback gain H lies along the +x axis, the vectors GH and 1+GH lie precisely along the −x axis, and the vector G/(1+GH) lies precisely along the +x axis. There is little or no closed loop phase error, particularly if the loop gain GH is high.

FIGS. 19A-19G illustrate a phase control technique in which phase cancellation is provided at the frequency of interest. FIGS. 19A, 19B illustrate the amplitude and phase response of a low pass filter with low phase error in its passband. At the frequency of interest $f_0$, the phase is slightly below 0°, which is enough to cause a problem in the oscillator, and the gain is also down slightly. By connecting a lead-lag network 241 in series with the filter 242, as illustrated in FIG. 19C, the shift in phase at the operating frequency can be eliminated. As illustrated in FIGS. 19D, 19E, the lead-lag network has a zero a and a pole b above $f_0$, which provide a small increase in gain and a slight positive phase angle peaking between the zero and the pole. The slight positive phase angle compensates for the shift in phase angle in the filter, with the result that the composite phase angle is 0° from DC through $f_0$, as illustrated in FIGS. 19F, 19G.

The technique of FIGS. 19A-19G is effective as long as the characteristics of the lead-lag network are matched to those of the filter. However, as in the case of the matching technique of FIGS. 16A-16C, errors can arise as components drift and change over time.

Figure 20A:
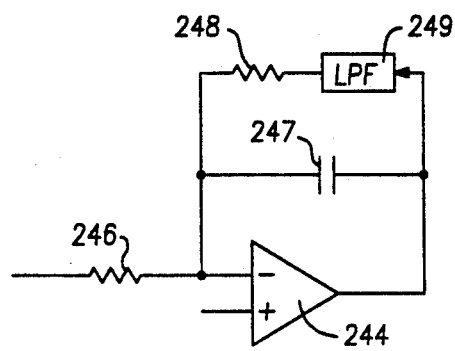
FIGS. 20A-20C illustrate a another technique for cancelling phase error at the frequency of interest in the embodiment of FIG. 11.
Figure 20B:
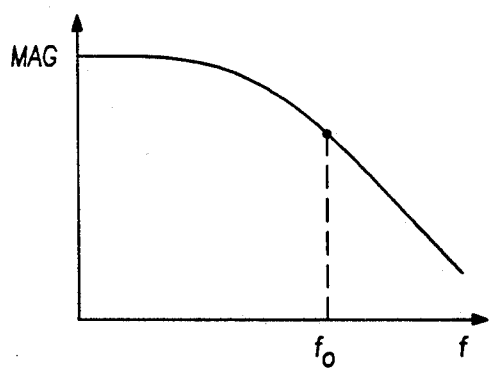
Figure 20C:
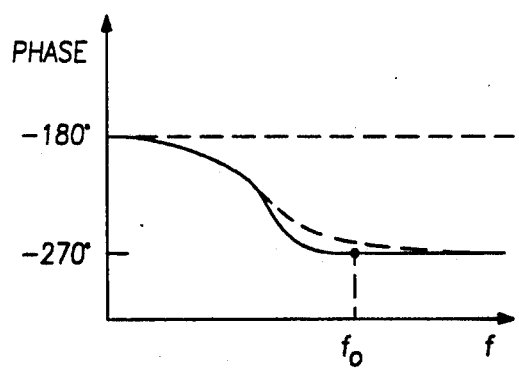

Another technique which avoids the problem of component drift is illustrated in connection with an integrator in FIGS. 20A-20C. The integrator includes an operational amplifier 244 with an input resistor 246 and an integrating capacitor 247 connected between its output and inverting input terminals. A resistor 248 is connected in parallel with the integrating capacitor for DC stability, and a low pass filter 249 is connected in series with the resistor to prevent the resistor from introducing a phase shift at $f_0$, the frequency of interest. Without the filter, resistor 248 would make the phase lag in the circuit slightly more positive than −270°, as indicated by the dashed line in FIG. 20C. Low pass filter 249 effectively takes the resistor out of the circuit at high frequencies, shifting the phase angle closer to −270° as it would be in a pure inverting integrator without the resistor. The current through the resistor is lagged by approximately 90° above the corner of the low pass filter, making the combination of the filter and the resistor appear inductive. This technique is employed in the washout filter of FIG. 14.

The oscillator circuit of FIG. 11 has a number of important features and advantages. It has lower random noise than the oscillators utilizing trans impedance amplifiers due to its reduced bandwidth, and it is easier to achieve low phase shift at both the main and tracer frequencies with this circuit. Jitter in the comparator output is also lower due to the reduced residual tracer at the output of the integrator, and there is also less tracer phase shift with less tracer going around the loop. Stability of the oscillator is enhanced over circuits utilizing trans impedance amplifiers, and a quadrature sinewave output is available in addition to the main oscillator signal without any additional circuit elements. Although loop gain shifts with changes in frequency, it is stabilized and maintained at unity by the AGC action of the gain control loop.

The loop gain rolls off at −40 db/decade for frequencies above the washout frequency, providing significant reduction of parasitic oscillation at overtone frequencies of the crystal.

As will be apparent to those skilled in the art, similar circuits can be devised to work at the parallel resonance of a crystal, or with other types of frequency determining networks, with similar benefits. Likewise, the circuit implementation could be performed in digital hardware or software, as well as in analog circuits as described herein.

It is apparent from the foregoing that a new and improved oscillator has been provided. While only certain presently preferred embodiments have been described in detail, as will be apparent to those familiar with the art, certain changes and modifications can be made without departing from the scope of the invention as defined by the following claims.

We claim:

1. In an oscillator:
   a frequency determining element, a charge amplifier and an integrator connected in a loop to provide an output signal of predetermined frequency;
   means for providing a control signal corresponding to the amplitude of the output signal; and
   means for adjusting the level of the output signal in accordance with the control signal to maintain the output signal at a substantially constant level.

2. In an oscillator:
   a frequency determining element, a charge amplifier and an integrator connected in a loop to provide an output signal of predetermined frequency;
   means for providing a control signal corresponding to the amplitude of the output signal; and
   a multiplier connected in the loop for multiplying the output signal by the control signal to adjust the level of the output signal in accordance with the control signal and thereby maintain the output signal at a substantially constant level.

3. In an oscillator:
a crystal, a charge amplifier and an integrator connected in a loop to provide an output signal of predetermined frequency;
means for providing a control signal corresponding to the amplitude of the output signal;
means for adjusting the level of the output signal in accordance with the control signal to maintain the output signal at a substantially constant level;
a compensating capacitor connected in parallel with the crystal; and
means for passing signals of substantially equal magnitude and opposite phase through the compensating capacitor and the crystal to cancel the effect of shunt capacitance in the crystal.

4. In an oscillator: a crystal element, a charge amplifier connected to the crystal element for providing a voltage corresponding to charge through the crystal element, an integrator for integrating the voltage from the charge amplifier, means connected between the integrator and the crystal element to complete a positive feedback loop in which the crystal element is driven in accordance with the integrated voltage, and means for maintaining the feedback loop at unity gain.

5. In an oscillator: a crystal element, a charge amplifier connected to the crystal element for providing a voltage corresponding to charge through the crystal element, an integrator for integrating the voltage from the charge amplifier, a multiplier connected between the integrator and the crystal element to complete a positive feedback loop in which the crystal element is driven in accordance with the integrated voltage, and means for applying a control signal to the multiplier for combination with the integrated voltage to control the level of the voltage with which the crystal element is driven to maintain the feedback loop at unity gain.

6. The oscillator of claim 5 wherein the means for applying a control signal to the multiplier includes means for differentiating the voltage from the charge amplifier, an envelope detector responsive to the differentiated voltage for providing a DC voltage corresponding to the charge through the crystal element, means for subtracting the DC voltage from a reference voltage to provide an error signal, and means connected to the multiplier for adjusting the gain of the multiplier in accordance with the error signal.

7. The oscillator of claim 6 wherein the means for differentiating the voltage from the charge amplifier comprises a high pass filter operating in a transition region between a stop band and a pass band.

8. In an oscillator: a crystal element, a charge amplifier connected to the crystal element for providing a voltage corresponding to charge through the crystal element, an integrator for integrating the voltage from the charge amplifier, means connected between the integrator and the crystal element to complete a positive feedback loop in which the crystal element is driven in accordance with the integrated voltage, and means for maintaining the feedback loop at unity gain, and a compensation loop for applying a current to the charge amplifier to cancel the effect of shunt capacitance in the crystal element.

9. The oscillator of claim 8 wherein the compensation loop includes a compensation capacitor connected to the input of the charge amplifier means for applying tracer signals of opposite phases of the compensation capacitor and the crystal element, means connected to the output of the charge amplifier for providing a control signal corresponding to the net tracer signal passing to the charge amplifier from the crystal element and the compensation capacitor, and means responsive to the control signal for adjusting the level of the tracer signal applied to the compensation capacitor to offset the tracer signal from the crystal element and eliminate the net tracer signal in the charge amplifier.

10. In an oscillator: a crystal element, a charge amplifier connected to the crystal element for providing a voltage corresponding to charge through the crystal element, an integrator for integrating the voltage from the charge amplifier, means connected between the integrator and the crystal element to complete a positive feedback loop in which the crystal element is driven in accordance with the integrated voltage, and means for maintaining the feedback loop at unity gain, and means connected between the output of the integrator and the input of the charge amplifier for applying a biasing current to the charge amplifier.

11. In an oscillator: a crystal element, a charge amplifier connected to the crystal element for providing a voltage corresponding to charge through the crystal element, an integrator for integrating the voltage from the charge amplifier, a multiplier connected between the integrator and the crystal element for applying a driving voltage to the crystal element in accordance with the voltage from the integrator, and means responsive to the voltage from the charge amplifier for applying a control signal to the multiplier to adjust the level of the driving voltage applied to the crystal element to maintain unity gain around the loop formed by the charge amplifier, the integrator, the multiplier and the crystal element.

12. The oscillator of claim 11 wherein the means for applying a control signal to the multiplier includes means for differentiating the voltage from the charge amplifier, an envelope detector responsive to the differentiated voltage for providing a DC voltage corresponding to the charge through the crystal element, means for subtracting the DC voltage from a reference voltage to provide an error signal, and means connected to the multiplier for adjusting the level of the driving voltage in accordance with the error signal.

13. The oscillator of claim 12 wherein the means for differentiating the voltage from the charge amplifier comprises a high pass filter operating in a transition region between a stop band and a pass band.

14. The oscillator of claim 11 including means connected between the output of the integrator and the input of the charge amplifier for applying a biasing current to the charge amplifier.

15. In an oscillator: a crystal element, a charge amplifier connected to the crystal element for providing a voltage corresponding to charge through the crystal element, an integrator for integrating the voltage from the charge amplifier, a multiplier connected between the integrator and the crystal element for applying a driving voltage to the crystal element in accordance with the voltage from the integrator, means responsive to the voltage from the charge amplifier for applying a control signal to the multiplier to adjust the level of the driving voltage applied to the crystal element to maintain unity gain around the loop formed by the charge amplifier, the integrator, the multiplier and the crystal element, a compensation capacitor connected to the input of the charge amplifier, means for applying tracer signals of opposite phases to the compensation capacitor and the crystal element, means connected to the output of the charge amplifier for providing a control signal corresponding to the net tracer signal passing to the charge amplifier from the crystal element and the compensation capacitor, and means responsive to the control signal for adjusting the level of the tracer signal applied to the compensation capacitor to offset the tracer signal from the crystal element and eliminate the net tracer signal in the charge amplifier.

16. The oscillator of claim 15 wherein the crystal element has a series resonant frequency on the order of 10 KHz, and the tracer signals have a frequency on the order of at least 100 KHz.

17. In an oscillator: a frequency determining element, a charge amplifier, and a circuit providing an odd number of integrations connected in a loop to provide an output signal of predetermined frequency.

18. In a method of generating a signal of predetermined frequency, the steps of: exciting a frequency determining element, a charge amplifier and an integrator connected in an oscillator loop to produce an output signal of predetermined frequency, providing a control signal corresponding to the amplitude of the output signal, and adjusting the level of the output signal in accordance with the control signal to maintain the output signal at a substantially constant level.

19. In a method of generating a signal of predetermined frequency, the steps of: exciting a frequency determining element, a charge amplifier and an integrator connected in an oscillation loop to produce an output signal of predetermined frequency, providing a control signal corresponding to the amplitude of the output signal, and multiplying the output signal by the control signal to adjust the level of the output signal in accordance with the control signal and thereby maintain the output signal at a substantially constant level.

20. In a method of generating a signal of predetermined frequency, the steps of: exciting a crystal, a charge amplifier and an integrator connected in an oscillation loop to produce an output signal of predetermined frequency, providing a control signal corresponding to the amplitude of the output signal, and passing signals of substantially equal magnitude and opposite phase through the crystal and a compensating capacitor in parallel with the crystal to cancel the effect of shunt capacitance in the crystal.

21. In a method of generating a signal of predetermined frequency with a crystal element connected in a positive feedback loop with a charge amplifier and an integrator, the steps of: amplifying charge through the crystal element with the charge amplifier to provide a voltage corresponding to said charge, integrating the voltage corresponding to the charge, exciting the crystal element in accordance with the integrated voltage, and maintaining the feedback loop at unity gain.

22. In a method of generating a signal of predetermined frequency with a crystal element connected in a positive feedback loop with a charge amplifier and an integrator, the steps of: amplifying charge through the crystal element with the charge amplifier to provide a voltage corresponding to said charge, integrating the voltage corresponding to the charge, exciting the crystal element in accordance with the integrated voltage, and maintaining the feedback loop at unity gain by multiplying the integrated voltage by a control signal to control the level of the voltage with which the crystal element is excited.

23. The method of claim 22 wherein the control signal is provided by differentiating the voltage from the charge amplifier, applying the differentiated voltage to an envelope detector to provide a DC voltage corresponding to the charge through the crystal element, subtracting the DC voltage from a reference voltage to provide an error signal.

24. The method of claim 23 wherein the voltage from the charge amplifier is differentiated by passing the voltage through a high pass filter operating in a transition region between a stop band and a pass band.

25. In a method of generating a signal of predetermined frequency with a crystal element connected in a positive feedback loop with a charge amplifier and an integrator, the steps of: amplifying charge through the crystal element with the charge amplifier to provide a voltage corresponding to said charge, integrating the voltage corresponding to the charge, exciting the crystal element in accordance with the integrated voltage, and maintaining the feedback loop at unity gain, and applying a current to the charge amplifier to cancel the effect of shunt capacitance in the crystal element.

26. The method of claim 25 wherein a compensation capacitor is connected to the input of the charge amplifier, tracer signals of opposite phases are applied to the compensation capacitor and the crystal element, the output of the charge amplifier is monitored to provide a control signal corresponding to the net tracer signal passing to the charge amplifier from the crystal element and the compensation capacitor, and the level of the tracer signal applied to the compensation capacitor is adjusted in response to the control signal to offset the tracer signal from the crystal element and eliminate the net tracer signal in the charge amplifier.

27. In a method of generating a signal of predetermined frequency with a crystal element connected in a positive feedback loop with a charge amplifier and an integrator, the steps of: amplifying charge through the crystal element with the charge amplifier to provide a voltage corresponding to said charge, integrating the voltage corresponding to the charge, exciting the crystal element in accordance with the integrated voltage, and maintaining the feedback loop at unity gain, and applying to the charge amplifier a biasing current derived from the integrated voltage.

28. In a method of generating a signal of predetermined frequency with an oscillator having a frequency determining crystal element, a charge amplifier, an integrator, and a multiplier connected in a loop, the steps of: amplifying charge through the crystal element in the charge amplifier to provide a voltage corresponding to said charge, integrating the voltage from the charge amplifier, applying the integrated voltage to the multiplier, driving the crystal element with a voltage from the multiplier, and adjusting the gain of the multiplier in response to the voltage from the charge amplifier to adjust the level of the driving voltage applied to the crystal element to maintain unity gain around the loop formed by the charge amplifier, the integrator, the multiplier and the crystal element.

29. The method of claim 28 wherein the level of the driving signal is adjusted by differentiating the voltage from the charge amplifier, applying the differentiated voltage to an envelope detector to provide a DC voltage corresponding to charge through the crystal element, subtracting the DC voltage from a reference voltage to provide an error signal, and adjusting the gain of the multiplier voltage in accordance with the error signal.

30. The method of claim 29 wherein the voltage from the charge amplifier is differentiated by applying that voltage to a high pass filter operating in a transition region between a stop band and a pass band.

31. The method of claim 28 including the step of applying to the charge amplifier a biasing derived from the integrated voltage.

32. In a method of generating a signal of predetermined frequency with a crystal element, a charge amplifier, and an integrator in an oscillation loop, the steps of: amplifying charge from the crystal element with the charge amplifier to provide a voltage corresponding to said charge, integrating the voltage from the charge amplifier in the integrator, applying a driving voltage to the crystal element with a multiplier in accordance with the voltage from the integrator, applying a control signal to the multiplier in accordance with the voltage from the charge amplifier to adjust the level of the driving voltage applied to the crystal element to maintain unity gain around the loop formed by the charge amplifier, the integrator, the multiplier and the crystal element, connecting a compensation capacitor to the input of the charge amplifier, applying tracer signals of opposite phases to the compensation capacitor and the crystal element, monitoring the output of the charge amplifier to provide a control signal corresponding to the net tracer signal passing to the charge amplifier from the crystal element and the compensation capacitor, and for adjusting the level of the tracer signal applied to the compensation capacitor in accordance with the control signal to offset the tracer signal from the crystal element and eliminate the net tracer signal in the charge amplifier.

33. The method of claim 32 wherein the crystal element has a series resonant frequency on the order of 10 KHz, and the tracer signals have a frequency on the order of at least 100 KHz.

34. In a method of generating a signal of predetermined frequency, the steps of connecting a frequency determining element, a charge amplifier, and a circuit providing an odd number of integrations in a loop, and exciting the loop to provide an output signal of predetermined frequency.

35. In a method of generating a signal of predetermined frequency, the steps of: exciting a frequency determining element connected in an oscillator loop to produce an output signal of predetermined frequency, providing a control signal corresponding to the amplitude of the output signal, and linearly multiplying the output signal by the control signal to maintain the amplitude of the output signal at a substantially constant level.

36. In a method of measuring variations in a physical parameters, the steps of: varying the series resonant frequency of a crystal in accordance with the parameter to be measured, exciting the crystal in an oscillator loop to produce an output signal having a frequency corresponding to the parameter to be measured, providing a control signal corresponding to the amplitude of the output signal, and linearly multiplying the output signal by the control signal to maintain the amplitude of the output signal at a substantially constant level.

37. In a method of compensating for the shunt capacitance of a frequency selective crystal element which is in series with a buffer amplifier in a seriesfeedback oscillator circuit, the steps of: applying current from the crystal element to the input of the buffer amplifier to produce an output signal, applying the output signal from the buffer amplifier to a differential amplifier to produce inverted and noninverted signals, applying the noninverted signal to the crystal element as a driving signal, and applying the inverted signal to a compensation capacitor connected to the input of the buffer amplifier to provide a compensation signal which is substantially equal in magnitude and opposite in phase to the signal passing through the shunt capacitance of the crystal element.

38. The method of claim 37 wherein the level of the compensation signal is adjusted by injecting a tracer signal having a different frequency than the series resonant frequency of the crystal element into the differential amplifier to produce tracer signals of opposite phase which pass respectively through the shunt capacitance of the crystal element and through the compensation capacitor and combine and cancel at the input of the buffer amplifier leaving a residual tracer signal, detecting the amplitude and phase of the residual tracer signal passing through said buffer amplifier with respect to the tracer signal to provide a tracer control signal corresponding to the amplitude and phase of the residual tracer signal, and adjusting the amplitude of the tracer signal passing through the compensation capacitor in accordance with the tracer control signal to minimize the residual tracer signal.

39. The method of claim 38 wherein the tracer signal is multiplied by the residual tracer signal to produce the tracer control signal, and the tracer control signal is filtered with a low pass filter.

40. The method of claim 38 wherein the compensation capacitor includes a voltage variable capacitor, and the amplitude of the tracer signal passing through the compensation capacitor is adjusted by varying the capacitance of the voltage variable capacitor.

41. In a method of reducing an interfering crosstalk signal coupled from a first crystal oscillator circuit to a second crystal oscillator circuit, the steps of: providing a crosstalk cancellation signal from the first crystal oscillator circuit, said crosstalk cancellation signal being oppositely phased with respect to the interfering crosstalk signal, and coupling the crosstalk cancellation signal into the second crystal oscillator circuit to cancel the interfering signal.

42. The method of claim 41 wherein the cancellation signal is provided by summing two oppositely phased signals from the first crystal oscillator to provide a cancellation signal having a selected amplitude and phase.

43. The method of claim 42 wherein the two oppositely phased signals are applied to opposite ends of a resistor having a variable tap from which the cancellation signal is obtained.

44. In a method for automatic cancelling of a crosstalk interference signal which is generated in a source circuit and coupled through stray coupling impedance to interfere with a crosstalk-sensitive circuit, the steps of: injecting a crosstalk tracer signal into the source circuit and into the crosstalk-sensitive circuit, said crosstalk tracer signal having a frequency which does not interfere with operation of the crosstalk-sensitive circuit, obtaining an inverted tracer signal from the source circuit, coupling the inverted tracer signal to the crosstalk-sensitive circuit so that the tracer signal coupled to the crosstalk-sensitive circuit is summed with the inverted tracer signal to provide a residual tracer signal which results from imperfect cancellation of the tracer signal and the inverted tracer signal, monitoring the amplitude of the residual tracer signal to provide a control signal, and adjusting the amplitude of the inverted tracer signal in accordance with the control signal to minimize the amplitude of the residual tracer signal.

45. In an oscillator: a frequency determining element and a circuit providing an even number of integrations connected in a loop to provide an output signal of predetermined frequency, and means for maintaining precise phase control around the loop, said means including means for isolating a phase error producing element at the predetermined frequency.

46. The oscillator of claim 45 wherein the means for isolating the error producing element includes a filter having attenuation at the predetermined frequency connected in series with the element.

47. In an oscillator: a frequency determining element, a charge amplifier, and a circuit providing an odd number of integrations connected in a loop to provide an output signal of predetermined frequency, and means for maintaining precise phase relationships around the loop without active phase adjustment.

48. In an oscillator: a frequency determining element and a circuit providing an even number of integrations connected in a loop to provide an output signal of predetermined frequency, said circuit including a feedback circuit having a forward gain path and a feedback gain path with components which are matched to provide substantially identical phase shifts in the two paths.

49. In an oscillator: a frequency determining element and a circuit providing an even number of integrations connected in a loop to provide an output signal of predetermined frequency, said circuit including a circuit having an overall phase shift substantially equal to 0° or 180°.

50. The oscillator of claim 49 wherein the circuit having an overall phase shift substantially equal to 0° or 180° comprises a wideband amplifier, an input resistor connected to an inverting input of the amplifier, and a feedback resistor connected between the output and the inverting input of the amplifier.

51. The oscillator of claim 49 wherein the circuit having an overall phase shift substantially equal to 0° or 180° comprises a pair of cascaded amplifier stages with second-order compensation.

52. The oscillator of claim 49 wherein the circuit having an overall phase shift substantially equal to 0° or 180° comprises first and second amplifiers, an input resistor connected to an inverting input of the first amplifier, a lead-lag network connected between the output of the first amplifier and a noninverting input of the second amplifier, and a feedback resistor connected between the output of the second amplifier and the inverting input of the first amplifier.

53. The oscillator of claim 47 wherein the means for maintaining precise phase control includes means for cancelling phase errors at the predetermined frequency.

54. In an oscillator: a frequency determining element and a circuit providing an even number of integrations connected in a loop to provide an output signal of predetermined frequency, said circuit including a lead-lag network connected in series with a low pass filter to cancel phase errors at the predetermined frequency.

* * * * *